(12) United States Patent
Kim et al.

(10) Patent No.: US 10,681,439 B2
(45) Date of Patent: Jun. 9, 2020

(54) ELECTRONIC DEVICE INCLUDING HEAT RADIATING STRUCTURE

(71) Applicant: Samsung Electronics Co., Ltd., Gyeonggi-do (KR)

(72) Inventors: Jinwoo Kim, Gyeonggi-do (KR); Sujin Jung, Gyeonggi-do (KR); Youngjin Cho, Gyeonggi-do (KR); Sungjin Park, Gyeonggi-do (KR); Hyunmin Oh, Gyeonggi-do (KR); Iksu Jung, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 16/535,569

(22) Filed: Aug. 8, 2019

(65) Prior Publication Data
US 2020/0053444 A1 Feb. 13, 2020

(30) Foreign Application Priority Data
Aug. 8, 2018 (KR) .................. 10-2018-0092714

(51) Int. Cl.
*H04R 1/02* (2006.01)
*H05K 7/20* (2006.01)
(Continued)

(52) U.S. Cl.
CPC .............. *H04R 1/025* (2013.01); *H04R 1/04* (2013.01); *H04R 1/24* (2013.01); *H04R 1/403* (2013.01); *H04R 3/12* (2013.01); *H05K 7/2039* (2013.01)

(58) Field of Classification Search
CPC ... H04R 1/02; H04R 1/40; H04R 3/12; H04R 1/24; H04R 1/04; H04R 9/022; H05K 7/20
(Continued)

(56) References Cited

U.S. PATENT DOCUMENTS

| 4,138,593 A | 2/1979 | Hasselbach et al. |
| 9,721,586 B1 | 8/2017 | Bay et al. |

(Continued)

FOREIGN PATENT DOCUMENTS

| JP | 5548967 | 7/2014 |
| KR | 2003-0055812 | 7/2003 |

(Continued)

OTHER PUBLICATIONS

International Search Report dated Nov. 29, 2019 issued in counterpart application No. PCT/KR2019/009822, 9 pages.

*Primary Examiner* — Melur Ramakrishnaiah
(74) *Attorney, Agent, or Firm* — The Farrell Law Firm, P.C.

(57) ABSTRACT

An electronic device is provided. The electronic device includes a housing including a first plate and at least one first opening; and a speaker structure spaced apart from the first plate and disposed in the housing, wherein the speaker structure includes a first structure which faces in a first direction, opposes the first plate, and forms a space connecting to the at least one first opening along with the first plate; a second opening formed by penetrating through a part of the first structure; at least one component disposed in the speaker structure and emitting heat; a thermal conducting member including a first portion disposed in the speaker structure and being in contact with the at least one component, and a second portion disposed in the second opening; and at least one speaker disposed in a direction different from the first direction.

20 Claims, 19 Drawing Sheets

(51) Int. Cl.
  *H04R 1/04*   (2006.01)
  *H04R 3/12*   (2006.01)
  *H04R 1/24*   (2006.01)
  *H04R 1/40*   (2006.01)

(58) Field of Classification Search
  USPC ............................... 381/335, 397, 412, 408
  See application file for complete search history.

(56) References Cited

U.S. PATENT DOCUMENTS

| | | |
|---|---|---|
| 2013/0177186 A1 | 7/2013 | Schul |
| 2014/0218878 A1* | 8/2014 | Choi ................... H01M 2/1022 361/752 |
| 2016/0345086 A1 | 11/2016 | Chamberlin et al. |
| 2017/0346650 A1 | 11/2017 | Eom et al. |
| 2018/0087767 A1 | 3/2018 | Trainer et al. |
| 2018/0091901 A1* | 3/2018 | Stanley ............... F21V 33/0056 |
| 2018/0143671 A1 | 5/2018 | Lee et al. |
| 2018/0190285 A1* | 7/2018 | Heckmann ............. H04R 9/022 |

FOREIGN PATENT DOCUMENTS

| | | |
|---|---|---|
| KR | 10-2017-0133221 | 12/2017 |
| KR | 10-2018-0057828 | 5/2018 |

\* cited by examiner

ELECTRONIC DEVICE INCLUDING HEAT RADIATING STRUCTURE

CROSS-REFERENCE TO RELATED APPLICATIONS

This application is based on and claims priority under 35 U.S.C. § 119 to Korean Patent Application No. 10-2018-0092714, filed on Aug. 8, 2018, in the Korean Intellectual Property Office, the disclosure of which is incorporated by reference herein in its entirety.

BACKGROUND

1. Field

The present disclosure relates to an electronic device including a heat radiating structure.

2. Description of Related Art

External components of electronic devices are increasingly integrated into electronic device to enhance users' convenience while supporting various functions. An electronic device may have various types of speakers and/or microphones mounted therein in order to support functions related to sounds. In addition, components for operating a speaker and/or microphone may be mounted in the electronic device.

When heat emitted from components arranged in an electronic device is not discharged to the outside or is not cooled, it may be difficult to normally operate the components due to overheating.

SUMMARY

An aspect of the present disclosure provides an electronic device including a heat radiating structure to discharge heat emitted from at least one component disposed in the electronic device to the outside of the electronic device.

In accordance with an aspect of the present disclosure, an electronic device is provided. The electronic device includes a housing including a first plate and at least one first opening; and a speaker structure spaced apart from the first plate and disposed in the housing, wherein the speaker structure includes a first structure which faces in a first direction, opposes the first plate, and forms a space connecting to the at least one first opening along with the first plate; a second opening formed by penetrating through a part of the first structure; at least one component disposed in the speaker structure and emitting heat; a thermal conducting member including a first portion disposed in the speaker structure and being in contact with the at least one component, and a second portion disposed in the second opening; and at least one speaker disposed in a direction different from the first direction.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
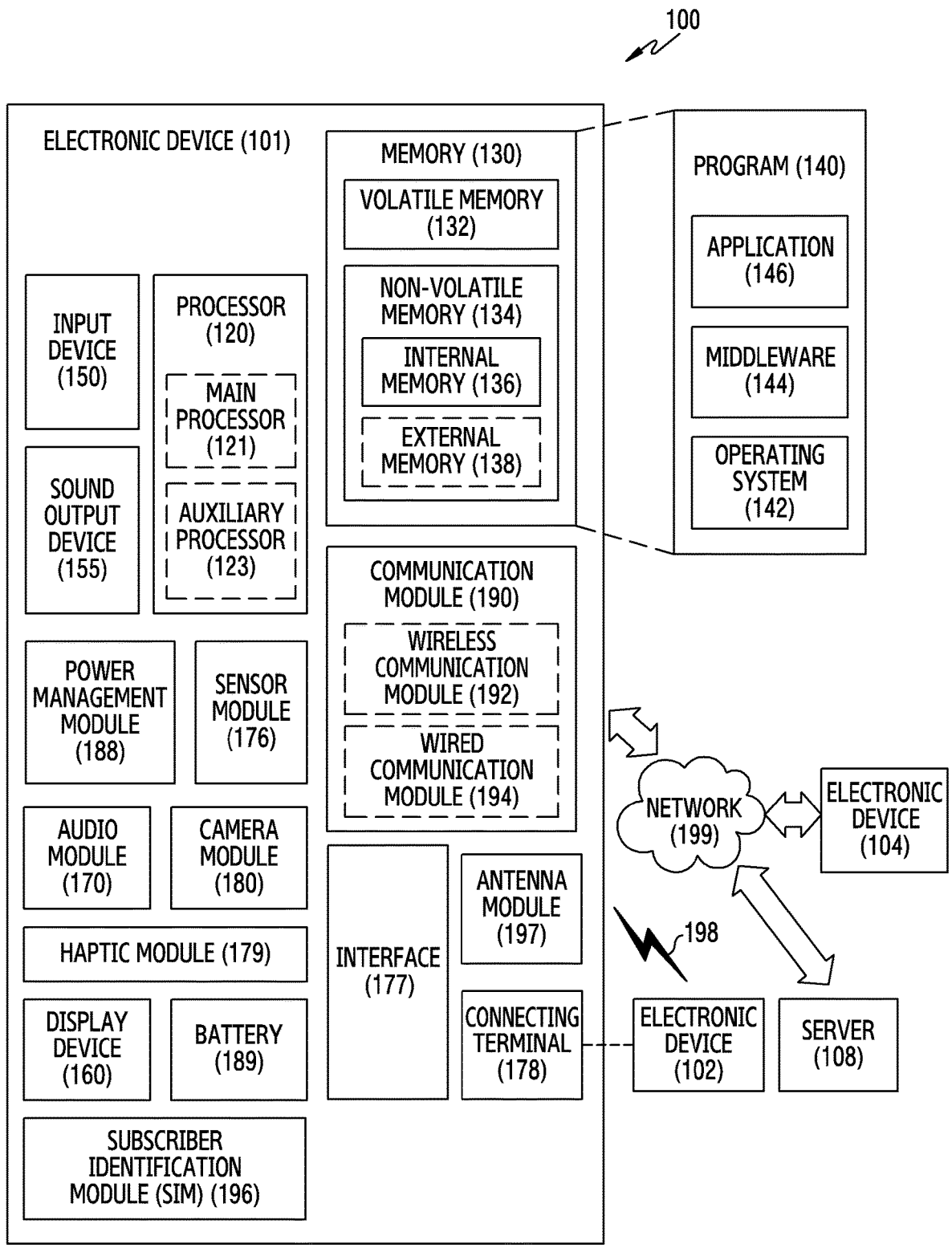
FIG. 1 is a block diagram of an electronic device in a network environment according to an embodiment.

Hereinafter, various embodiments of the present disclosure are described with reference to the accompanying drawings. It should be appreciated that the present disclosure is not intended to be limited to a particular embodiment, but includes various modifications, equivalents, and/or alternatives of the disclosure.

With regard to the description of the accompanying drawings, similar reference numerals may be used to refer to similar elements. A singular form of a noun corresponding to an item may include one or more of the things, unless the relevant context clearly indicates otherwise.

As used herein, the expressions "have," "may have," "include," "comprise," "may include," and "may comprise" indicate existence of corresponding features (for example, elements such as numeric values, functions, operations, or components) but do not preclude the presence of additional features. In the present disclosure, each of such phrases as "A or B," "at least one of A and B," "at least one of A or B," "A, B, or C," "at least one of A, B, and C," and "at least one of A, B, or C" may include all possible combinations of the items enumerated together in a corresponding one of the phrases. As used herein, such terms as "1st," "2nd," "first,"

and "second" may be used to simply distinguish a corresponding component from another, but do not limit the components in another aspect (for example, importance or order). It is to be understood that if an element (for example, a first element) is referred to, with or without the term "operatively" or "communicatively," as "coupled with," "coupled to," "connected with," or "connected to" another element (for example, a second element), it indicates that the element may be coupled with the other element directly (for example, wiredly), wirelessly, or via a third element.

An electronic device according to an embodiment of the present disclosure may be one of various types of electronic devices. The electronic device may include, for example, a mobile communication device (for example, a smartphone), a computer device, a portable multimedia device, a portable medical device, a camera, a wearable device, or a home appliance. An electronic device according to an embodiment of the present disclosure is not limited to the above-described devices. In the present disclosure, the term "user" may refer to a person who uses an electronic device or a device that uses an electronic device (for example, an artificial intelligence electronic device, such as an artificial intelligence speaker).

FIG. 1 is a block diagram illustrating an electronic device 101 in a network environment 100 according to an embodiment.

Referring to FIG. 1, the electronic device 101 in the network environment 100 may communicate with an electronic device 102, via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. The electronic device 101 may include a processor 120, a memory 130, an input device 150, a sound output device 155, a display device 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. At least one (e.g., the display device 160 or the camera module 180) of the components may be omitted from the electronic device 101, or one or more other components may be added in the electronic device 101. Some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or a software component) of the electronic device 101 coupled with the processor 120, and may perform various data processing or computations. As at least part of data processing or computation, the processor 120 may load a command or data received from the sensor module 176 or the communication module 190 in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of, the main processor 121.

The auxiliary processor 123 may control at least some of functions or states related to at least the display device 160, the sensor module 176, or the communication module 190 among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least the processor 120 or the sensor module 176 of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing a record, and the receiver may be used for incoming calls. The receiver may be implemented as separate from, or part of, the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure an intensity of force incurred by a touch.

The audio module 170 may convert a sound into an electrical signal and vice versa. The audio module 170 may obtain a sound via the input device 150, or output a sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device 102 directly (e.g., wiredly) or wirelessly. The interface 177 may include, for example, a high definition multimedia interface (HDMI), a universal serial bus (USB) interface, a secure digital (SD) card interface, or an audio interface.

The connecting terminal 178 may include a connector via which the electronic device 101 may be physically connected with an external electronic device 102. The connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the electronic device 102, the electronic device 104, or the server 108 and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with an external electronic device via the first network 198 (e.g., a short-range communication network, such as Bluetooth™, wireless-fidelity (Wi-Fi) direct, or a standard of the Infrared Data Association (IrDA)) or the second network 199 (e.g., a long-range communication network, such as a cellular network, the Internet, or a computer network (e.g., a LAN or a wide area network (WAN)). These various types of communication modules may be implemented as a single component (e.g., a single integrated circuit or chip), or may be implemented as multi components (e.g., multi chips) separate from each other. The wireless communication module 192 may identify and authenticate the electronic device 101 in a communication network, such as the first network 198 or the second network 199, using subscriber information (e.g., an international mobile subscriber identity (IMSI)) stored in the SIM 196.

The antenna module 197 may transmit or receive a signal or power to or from the outside (e.g., the external electronic device) of the electronic device 101. The antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type from, the electronic device 101. All or some of operations to be executed at the electronic device 101 may be executed at one or more of the electronic device 102, the electronic device 104, or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer the outcome to the electronic device 101. The electronic device 101 may provide the outcome, with or without further processing, as at least part of a reply to the request. To that end, a cloud computing, distributed computing, or client-server computing technology may be used, for example.

The electronic device 101 may be one of various types of electronic devices. The electronic devices may include, for example, a portable communication device (e.g., a smart phone), a computer device, a portable multimedia device, a portable medical device, a camera, a wearable device, or a home appliance. The electronic devices are not limited to those described above.

As used herein, the term "module" may include a unit implemented in hardware, software, or firmware, and may be used interchangeably with other terms, for example, "logic," "logic block," "part," or "circuitry". The term "module" may refer to a single integral component, or a minimum unit or part thereof, adapted to perform one or more functions. For example, the term "module" may refer to a device implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138 in the non-volatile memory 134) that is readable by a machine (e.g., the electronic device 101). For example, the processor 120 of the electronic device 101 may invoke at least one of the one or more instructions stored in the storage medium, and execute the one or more instructions, with or without using one or more other components under the control of the processor 120. This allows the electronic device 101 to be operated to perform at least one function according to the at least one instruction invoked. The one or more instructions may include code generated by a complier or code executable by an interpreter. The machine-readable storage medium may be provided in the form of a non-transitory storage medium. Wherein, the term "non-transitory" simply indicates that the storage medium is a tangible device, but does not include a signal (e.g., an electromagnetic wave), where this term does not differentiate between where data is semi-permanently stored in the storage medium and where data is temporarily stored in the storage medium.

A method according to an embodiment of the present disclosure may be included and provided in a computer program product. The computer program product may be traded as a product between a seller and a buyer. The computer program product may be distributed in the form of a machine-readable storage medium (e.g., a compact disc read only memory (CD-ROM)), or distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of a manufacturer's server, a server of an application store, or a relay server.

According to an embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
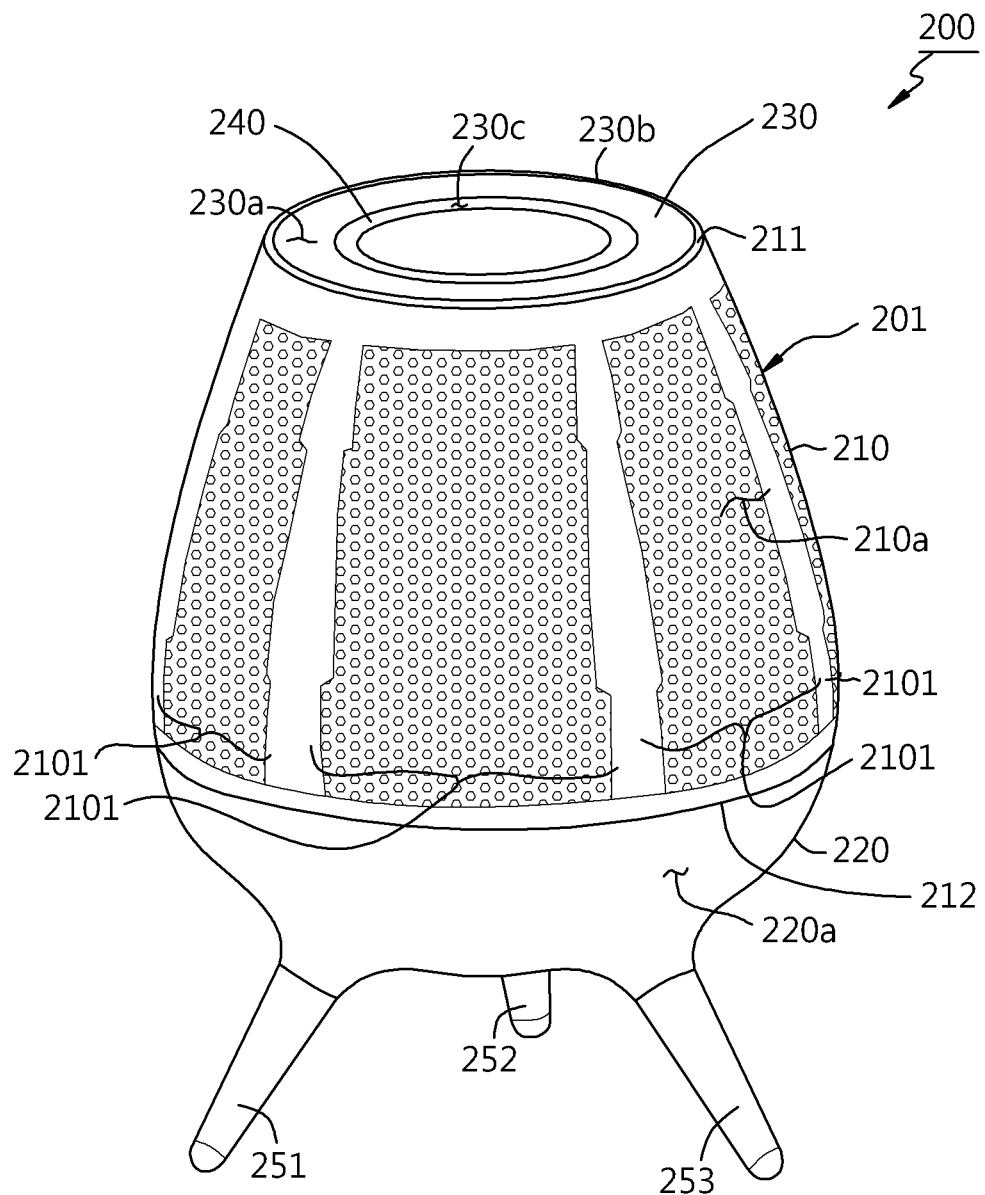
FIG. 2 is a perspective view of an electronic device including a heat radiating structure according to an embodiment.

FIG. 2 is a perspective view of an electronic device 200 including a heat radiating structure according to an embodiment.

Referring to FIG. 2, the electronic device 200 (for example, the electronic device 101) may include a housing 201 forming an exterior of the electronic device 200. For example, the housing 201 may include at least one of a first exterior member 210, a second exterior member 220, or a third external member 230. The first exterior member 210 may include a first edge 211 or a second edge 212 disposed opposite the first edge 211. The first exterior member 210 may have a cylindrical shape becoming gradually narrower from the second edge 212 toward the first edge 211. For example, the first edge 211 may have a circular shape having a first diameter, and the second edge 212 may have a circular shape having a second diameter greater than the first diameter. The first exterior member 210 may include an opening forming the second edge 212. The second exterior member 220 may be coupled to the second edge 212 of the first exterior member 210, and may have a convex shape in a direction from the first edge 211 to the second edge 212. An outer surface 210a formed by the first exterior member 210 and an outer surface 220a formed by the second exterior member 220 may be connected with each other seamlessly. The third exterior member 230 may be coupled to the first edge 211 of the first exterior member 210, and may form a top side surface 230a of the electronic device 200.

According to an embodiment, the electronic device 200 may include three legs 251, 252, and 253 coupled with the second exterior member 220. The three legs 251, 252, and 253 may be used to stand the electronic device 200 on a floor. Outer surfaces of the three legs 251, 252, and 253 and the outer surface 220a of the second exterior member 220 may be connected with each other seamlessly.

At least one of the first exterior member 210, the second exterior member 220, or the third exterior member 230 may be formed with various materials such as polymer or metal (for example, aluminum, stainless steel, or magnesium). The first exterior member 210 and the third exterior member 230, or the first exterior member 210 and the second exterior member 220 may be integrally formed with each other and may include the same material.

The third exterior member 230 may include a recess 230c which is depressed toward the second exterior member 220. For example, the third exterior member 230 may be a circular plate which has an edge 230b coupled along the first edge 211. When viewed above the third exterior member 230, the recess 230c may be spaced apart from the edge 230b by a specified distance, and may be formed in a circular shape along the edge 230b.

According to an embodiment, the third exterior member 230 may include a plurality of microphone or mic holes formed in the recess 230c. The plurality of mic holes may be arranged at regular intervals to be aligned with a plurality of microphones arranged in the housing 201 of the electronic device 200 (for example, one or more microphones included in the input device 150). External sound may enter the plurality of microphones through the plurality of mic holes.

The electronic device 200 may include a fourth exterior member 240 coupled to the recess 230c of the third exterior member 230, and the fourth exterior member 240 may have an annular shape corresponding to the recess 230c. The fourth exterior member 240 may cover the plurality of mic holes formed in the recess 230c and may include a plurality of penetrating holes to allow sound to pass therethrough. For example, the fourth exterior member 240 (for example, a sound permeable member such as a grill) may include the plurality of penetrating holes which are smaller than the plurality of mic holes and are formed more densely, and external sound may enter the plurality of mic holes of the recess 230c through the plurality of penetrating holes of the fourth exterior member 240.

The first exterior member 210 may include groups including a plurality of penetrating holes (hereinafter, referred to as a plurality of first penetrating hole groups) 2101, and the plurality of first penetrating hole groups 2101 may be arranged at regular intervals along the circumference of the first exterior member 210. The plurality of first penetrating hole groups 2101 may be aligned with a plurality of first speakers arranged in the housing 201, and sound outputted through the first speaker may be discharged to the outside through the plurality of penetrating holes of a corresponding penetrating hole group.

The second exterior member 220 may include a plurality of penetrating holes (hereinafter, referred to as a second penetrating hole group) arranged on the opposite side surface (for example, a bottom surface) of the top side surface 230a. The second penetrating hole group may be aligned with a second speaker (for example, a speaker outputting sound of a lower register than that of the first speaker) disposed in the housing 201, and sound outputted through the second speaker may be discharged to the outside through the second penetrating hole group. For example, when the electronic device 200 is stood on a floor by the three legs 251, 252, and 253, a space may be formed between the bottom surface including the second penetrating hole group and the floor. The sound outputted from the second speaker may be discharged to the outside through the space.

Figure 3:
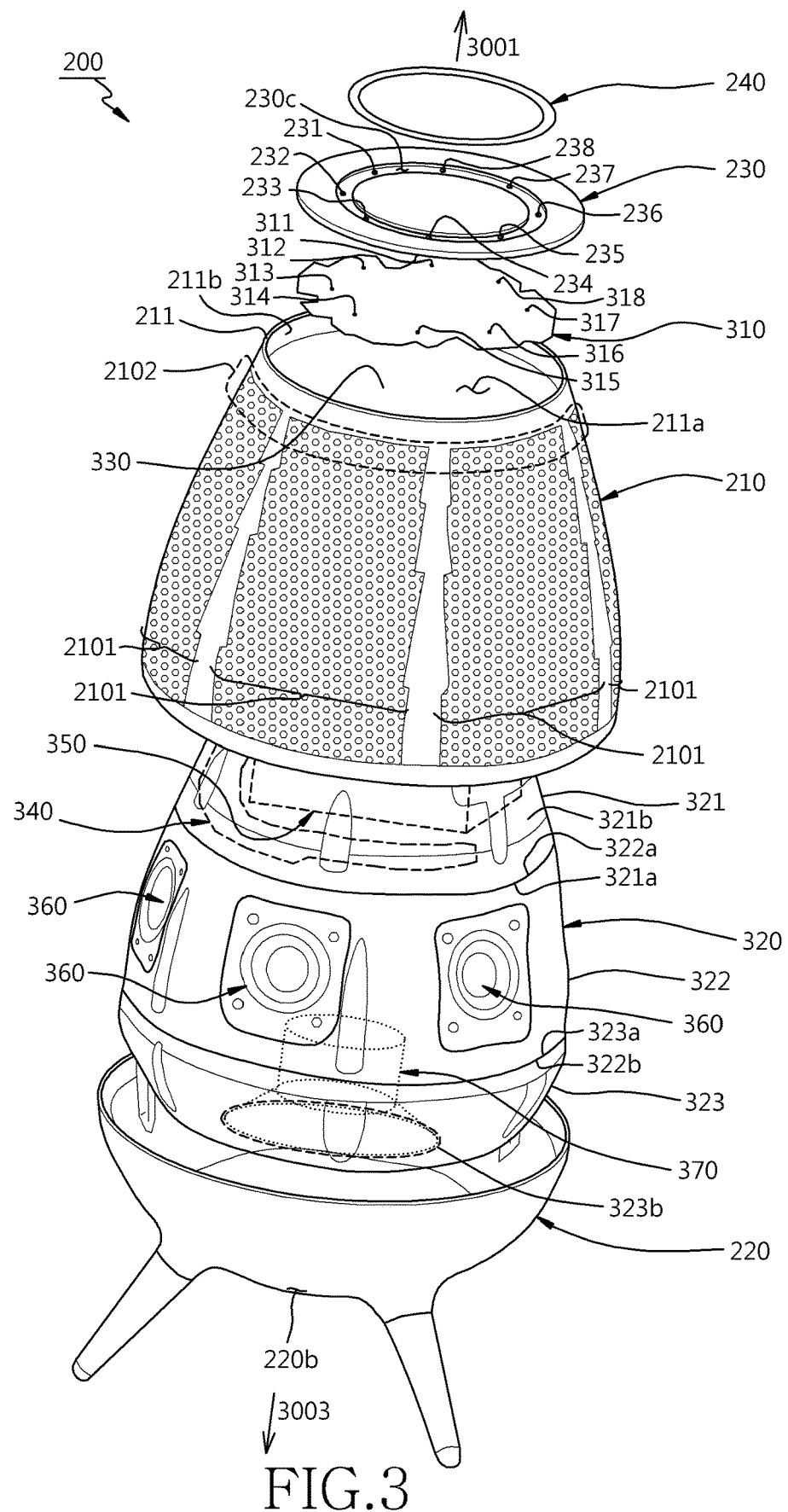
FIG. 3 is an exploded perspective view of the electronic device of FIG. 2.
Figure 4A:
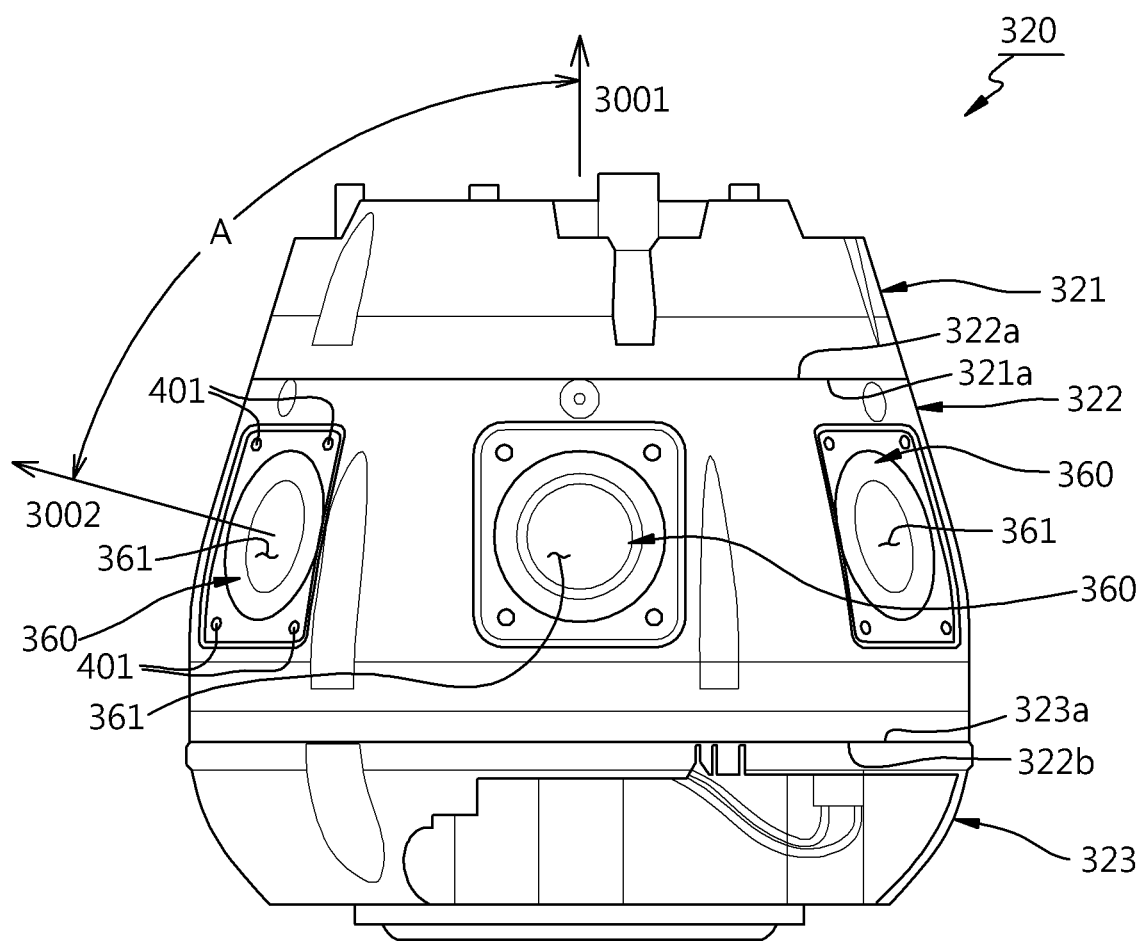
FIG. 4A is a side view of a speaker structure of FIG. 3.
Figure 4B:
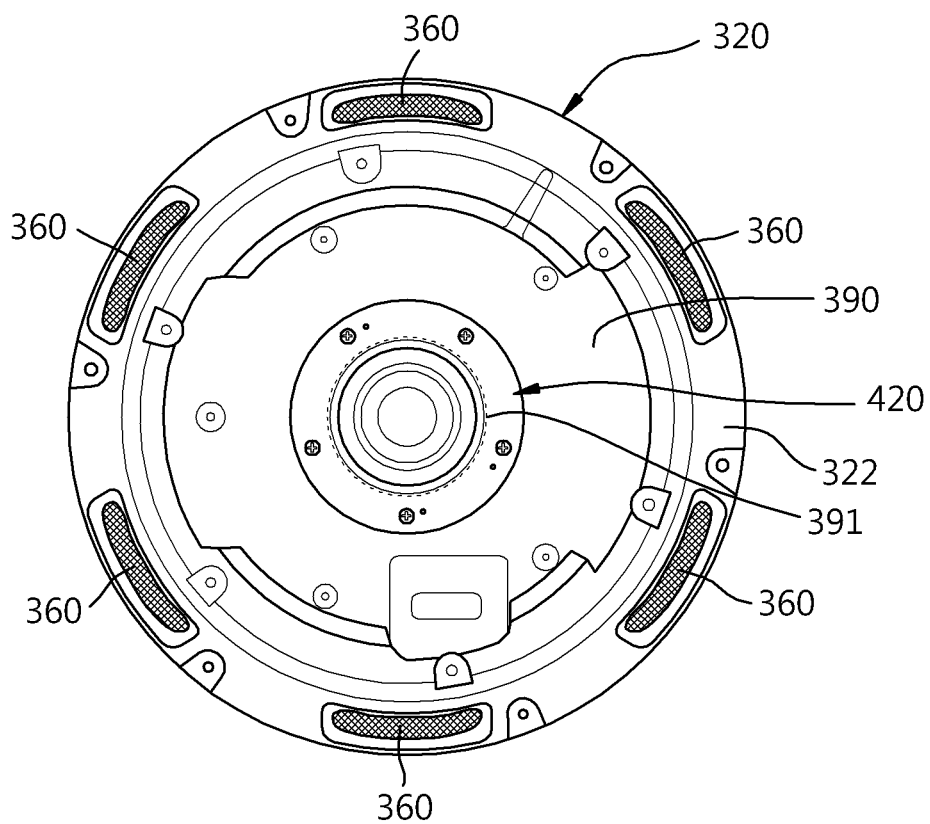
FIG. 4B is a top view of the speaker structure of FIG. 3.
Figure 4C:
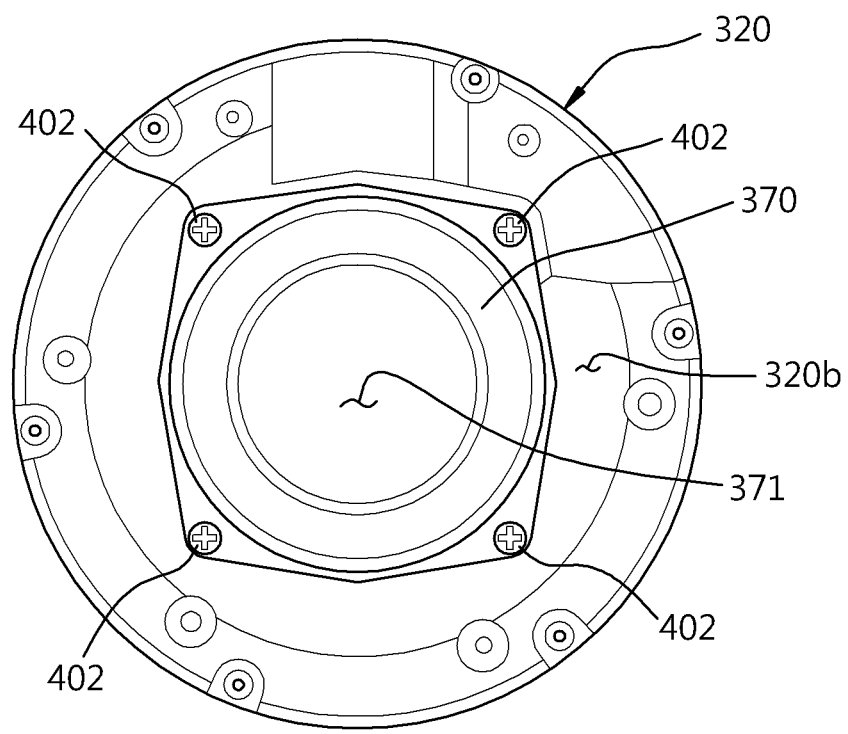
FIG. 4C is a bottom view of the speaker structure of FIG. 3.

FIG. 3 is an exploded perspective view of the electronic device 200 of FIG. 2. FIG. 4A is a side view of a speaker structure 320 of FIG. 3. FIG. 4B is a top view of the speaker structure 320 of FIG. 3. FIG. 4C is a bottom view of the speaker structure 320 of FIG. 3.

Referring to FIG. 3, the electronic device 200 may include at least one of the first exterior member 210, the second exterior member 220, the third exterior member 230, the fourth exterior member 240, a first printed circuit board 310, or a speaker structure 320. The first exterior member 210, the second exterior member 220, the third exterior member 230, and the fourth exterior member 240 are substantially the same as those of FIG. 2, and thus a detailed description thereof is omitted here.

The first exterior member 210 may include a recess 211a. For example, the first exterior member 210 may include a first plate 330 extended from the first edge 211 and disposed above the speaker structure 320 apart therefrom. The first plate 330 may include a surface facing in a first direction 3001 and opposing a first printed circuit board 310, and a surface facing in a third direction 3003 which is the opposite of the first direction 3001, and opposing the speaker structure 320. The recess 211a may be formed by the first plate 330, and a wall 211b connecting the first plate 330 and the first edge 211. The first printed circuit board 310 may be disposed in the recess 211a between the first plate 330 and the third exterior member 230. The first plate 330 may be provided separately from the first exterior member 210 and may be coupled with the first exterior member 210.

The first printed circuit board 310 may include a plurality of microphones aligned with a plurality of mic holes 231, 232, 233, 234, 235, 236, 237, and 238 formed in the recess 230c of the third exterior member 230. The plurality of microphones may be arranged on a bottom surface of the first printed circuit board 310 opposing the first plate 330 to be aligned with the plurality of mic holes 231, 232, 233, 234, 235, 236, 237, and 238. The first printed circuit board 310 may include a plurality of penetrating holes 311, 312, 313, 314, 315, 316, 317, and 318 aligned with the plurality of mic holes 231, 232, 233, 234, 235, 236, 237, and 238 of the third exterior member 230 or overlapping at least in part. External sound may enter a corresponding microphone through the mic hole 231, 232, 233, 234, 235, 236, 237 or and 238 and a penetrating hole 311, 312, 313, 314, 315, 316, 317, or 318 of the first printed circuit board 310 aligned therewith. The electronic device 200 may include a plurality of sound inflow paths formed by the plurality of mic holes 231, 232, 233, 234, 235, 236, 237, and 238 and the plurality of penetrating holes 311, 312, 313, 314, 315, 316, 317, and 318 of the first printed circuit board 310 aligned therewith. The electronic device 200 may include various sealing structures to prevent sound from leaking into the plurality of sound inflow paths. Sound entering a sound inflow path used by one microphone may not leak into a sound inflow path used by another microphone, and accordingly, performance regarding exact speech recognition or direction recognition using the plurality of microphones can be guaranteed.

The first printed circuit board 310 may include circuitry or a module related to various operations related to the plurality of microphones and/or a plurality of speakers (for example, the plurality of first speakers 360, the second speaker 370). For example, at least some of the elements of FIG. 1 (for example, the processor 120, the memory 130, the audio module 170, a speech recognition module, the interface 177, the power management module 188, or the communication module 190) may be mounted in the first printed circuit board 310. The processor 120 or the speech recognition module mounted in the first printed circuit board 310 may conduct speech recognition by using the plurality of microphones. For example, the processor 120 may determine a direction in which a voice is provided based on an acoustic signal obtained through the plurality of microphones, and may control at least one speaker based on the determined direction (for example, the processor 120 may output a response to the inputted voice by using a speaker corresponding to the determined direction).

The speaker structure 320 is a structure in which the plurality of speakers are coupled with one another, and may be disposed in a housing 201 including the first exterior member 210, the second exterior member 220, and/or the third exterior member 230. The speaker structure 320 may be spaced apart from the first plate 330 in the third direction 3003.

The speaker structure 320 may include a plurality of openings to which the plurality of first speakers 360 are coupled, and an opening to which the second speaker 370 is coupled. For example, when the plurality of first speakers 360 and the second speaker 370 are coupled to the openings, the speaker structure 320 may have an inner space substantially sealed therein. The plurality of first speakers 360 or the second speaker 370 may output sound by using a resonance of the sealed inner space of the speaker structure 320.

Referring to FIG. 4A, the plurality of first speakers 360 may be arranged in the speaker structure 320 to face in a second direction 3002 which forms an angle A ranging from about 45 to 135 degrees with respect to the first direction 3001. For example, the plurality of first speakers 360 may be coupled to the openings formed on the speaker structure 320 by using bolts 401. Vibration plates 361 of the plurality of first speakers 360 may face the plurality of first penetrating hole groups 2101 in the second direction 3002, and the plurality of first speakers 360 may be aligned with the plurality of first penetrating hole groups 2101 formed on the first exterior member 210.

Referring to FIG. 3, the second speaker 370 may be disposed in the speaker structure 320 to face in the third direction 3003. For example, the second exterior member 220 may include a second penetrating hole group formed on a surface 220b facing in the third direction 3003 (for example, a surface opposing the top side surface 230a).

Referring to FIG. 4C, the second speaker 370 may be coupled to an opening formed on one surface 320b of the speaker structure 320 opposing the second penetrating hole group, and a vibration plate 371 of the second speaker 370 may face the second penetrating hole group. The second speaker 370 may be coupled to the opening of the speaker structure 320 by using bolts 402.

Referring to FIGS. 3 and 4A, the speaker structure 320 may include at least one of a first structure 321, a second structure 322, a third structure 323, a second printed circuit board 340 or a power supply 350.

The first structure 321 (or a first enclosure) may be disposed between the first plate 330 and the second structure 322, and may provide a space to accommodate at least part of the second printed circuit board 340 and/or the power supply 350. For example, the first structure 321 may include a sidewall 321b extended from an edge 321a coupled with the second structure 322 along the first exterior member 210, and a second plate opposing the first plate 330. The first structure 321 may be formed by the sidewall 321b and the second plate to provide a space which is convex in the first direction 3001. The second printed circuit board 340 and/or the power supply 350 may be disposed in the space formed in the first structure 321 and convex in the first direction 3001.

The second printed circuit board 340 may include one or more amplifiers (or amplifier integrated circuits (AMP ICs)) related to power or speaker output, and/or a circuit controlling operations of the one or more amplifiers. The second printed circuit board 340 may be electrically connected with the first printed circuit board 310 through an electric connection member such as a flexible printed circuit board (FPCB).

The power supply 350 is circuitry or a structure related to power, and may receive power from a power source, change a current or voltage characteristic (for example, convert alternating current (AC) power into direct current (DC) power), and may deliver the power to the electronic device 200. For example, the power supply 350 may include a power supply device including a switching regulator to convert power efficiently. The power supply 350 may include a switched mode power supply which is a DC stabilization power supply to stabilize output by controlling an on-off time ratio of a semiconductor element.

The power supply 350 may be omitted in the electronic device 200. For example, the power supply 350 may be disposed in a cable connecting the electronic device 200 and an external power source.

The electronic device 200 may include a third printed circuit board accommodated in the space of the first structure 321 at least in part. The third printed circuit board may be utilized as a wire to electrically connect the plurality of first speakers 360 and the second speaker 370 to the first printed circuit board 310. The third printed circuit board may reduce the length of a wire between the plurality of speakers and the first printed circuit board 310, and accordingly, an electromagnetic influence (for example, an electromagnetic noise) of the wire on other elements (for example, an antenna) can be reduced.

The second structure 322 (or a second enclosure) may be disposed between the first structure 321 and the third structure 323. For example, the second structure 322 may have a cylindrical shape extending from an edge 322a coupled with the first structure 321 to an edge 322b coupled with the third structure 323, and may include opposite openings forming the edges 322a and 322b.

Referring to FIG. 4B, the plurality of first speakers 360 may be arranged in the second structure 322 along the circumference of the second structure 322. For example, when viewed in the third direction 3003 in FIG. 3, the plurality of first speakers 360 may be arranged at regular intervals in a circular shape. Six first speakers may be arranged at regular intervals in a circular shape. The first speakers are not limited to the number or position illustrated in FIG. 4B.

The second structure 322 may include an inner structure formed of a partition wall to provide a plurality of first sealed spaces corresponding to the plurality of first speakers 360. The plurality of first speakers 360 may output sound by using the plurality of first spaces. The second speaker 370 may output sound by using a second space separated from the plurality of first spaces by the partition wall in the inner space formed by the first structure 321, the second structure 322, and the third structure 323.

The second speaker 370 may output sound of a different register from that of the plurality of first speakers 360. For example, the second speaker 370 may output sound of a lower register than that of the first speakers 360, and the second speaker 370 may include a woofer. The plurality of first speakers 360 may include a tweeter.

The third structure 323 (or a third enclosure) has a shape extending from an edge 323a in FIGS. 3 and 4A coupled with the second structure 322 to an edge 323b coupled with the second speaker 370, and may include opposite openings forming the edges 322a and 322b. The third structure 323 and the second structure 322 may be integrally formed with each other, and may include the same material.

The speaker structure 320 may include a heat radiating structure (for example, at least one thermal conducting member, such as a heat sink or spread)) to discharge heat emitted from at least one component included in the speaker structure 320 to the outside. The heat radiating structure may prevent at least one component from overheating. For example, the at least one component may include a resistive component, and, when the at least one component consumes a current, a part of the current may be converted into thermal energy by the resistive component, and may be emitted. The at least one component may be related to the plurality of first speakers 340 and/or the second speaker 350 included in the speaker structure 320, and may be distinct from a component provided to intentionally emit heat. For example, heat may be emitted from the plurality of AMP ICs included in the second printed circuit board 340, or the power supply 350.

A portion of the plurality of first penetrating hole groups 2101 may be used as openings for discharging sound outputted from the plurality of first speakers 360, and the other portion of the plurality of first penetrating hole groups 2101 may be used as openings for discharging heat to the outside in the heat radiating structure. The heat radiating structure may allow heat emitted from at least one component disposed in the speaker structure 320 to be discharged to the outside through penetrating holes (hereinafter, first openings) 2102 of the plurality of first penetrating hole groups 2101 that are adjacent to the first edge 211 of the first exterior member 210. The first openings 2102 may be disposed on an upper side of the electronic device 200 to allow heat emitted from at least one component disposed in the speaker structure 320 and rising up to be discharged to the outside.

The heat radiating structure may include a thermal conducting member which is in contact with at least one component disposed in the speaker structure 320 at least in part. The thermal conducting member may receive heat emitted from the at least one component and may discharge the heat to the air.

The heat radiating structure may have a space (or a passage) formed therein to guide heat discharged from the thermal conducting member to move toward the first openings 2102. The first plate 330 of the first exterior member 210 and the second plate 390 of the first structure 321 opposing the first plate 330 may form the space or passage (hereinafter, referred to as a duct) facing the first openings 2102. The thermal conducting member used in the heat radiating structure may include a first portion in contact with at least one component, and a second portion 420 in contact with the first portion at least in part and exposed to the duct at least in part. For example, heat emitted from at least one component may be transferred to the second portion 420 from the at least one component through the first portion. Heat emitted from at least one component may flow into the second portion 420 through the first portion due to conduction by which heat flows from a high temperature portion to a low temperature portion. The first portion is a medium for transmitting heat to the second portion 420 coupled with the duct, and may be formed separately from the second portion 420. The first portion which is a thermal conducting medium between the second portion 420 and at least one component may be included due to a spacing distance between the second portion 420 and at least one component and/or an inner structure of the speaker structure 320.

The second portion 420 of the thermal conducting member 400 may be disposed in a second opening 391 formed in the second plate 390. The second portion 420 of the thermal conducting member may block the opening of the second plate 390, and may form a sealed inner space of the speaker structure 320.

A thermal conductive material (for example, a thermal interfacing material (TIM)) may be disposed between the first portion and the second portion 420, and the thermal conductive material may increase thermal conductivity by increasing a contact area for thermal conduction between the first portion and the second portion 420. The thermal conductive material may be disposed between the first portion and at least one component, and may increase thermal conductivity by increasing a contact area for thermal conduction between the first portion and at least one component.

The first portion and the second portion 420 of the thermal conducting member may be formed with different materials. The first portion and the second portion 420 of the thermal conducting member may be formed with the same material. The first portion and the second portion 420 of the thermal conducting member may be integrally formed with each other, and may include the same material.

A speaker (for example, at least one of the plurality of first speakers 360 or the second speaker 370) may vibrate when outputting sound, and this vibration may be transferred to the speaker structure 320. The vibration of the speaker structure 320 in the housing 201 may enhance the performance of discharging heat from the second portion 420 of the thermal conducting member to the first openings 2102. For example, convective heat transfer which is a method for transferring energy between a solid surface and gas may act in the air in the duct from the second portion 420 of the thermal conducting member. The vibration of the speaker structure 320 may cause a motion (or movement) of the air in the duct, thereby enhancing convective heat transfer performance between the second portion 420 of the thermal conducting member and the air in the duct. For example, the vibration of the speaker structure 320 may cause a forced convection using a means for causing movement of a fluid like a pump. A blower may further be included for the forced convection.

The speaker structure 320 may have an outer surface supported (or fixed) by a structure (for example, ribs) provided inside the first exterior member 210 or inside the second exterior member 220. There may be a separation space between the first exterior member 210 or the second exterior member 220 and the speaker structure 320, and the separation space may reduce the vibration of the structure 320 transferred to the first exterior member 210 and/or the second exterior member 220 when the plurality of first speakers 340 or the second speaker 350 outputs sound. To this end, when the plurality of first speakers 340 or the second speaker 350 outputs sound, the movement of the air in the duct caused by the vibration of the speaker structure 320 may increase, such that performance of discharging heat emitted from at least one component to the first openings 2102 through the duct can be enhanced. There may be provided vibration structures of various shapes for allowing the speaker structure 320 to vibrate in the space formed inside the first exterior member 210 or in the second exterior member 220.

Figure 5:
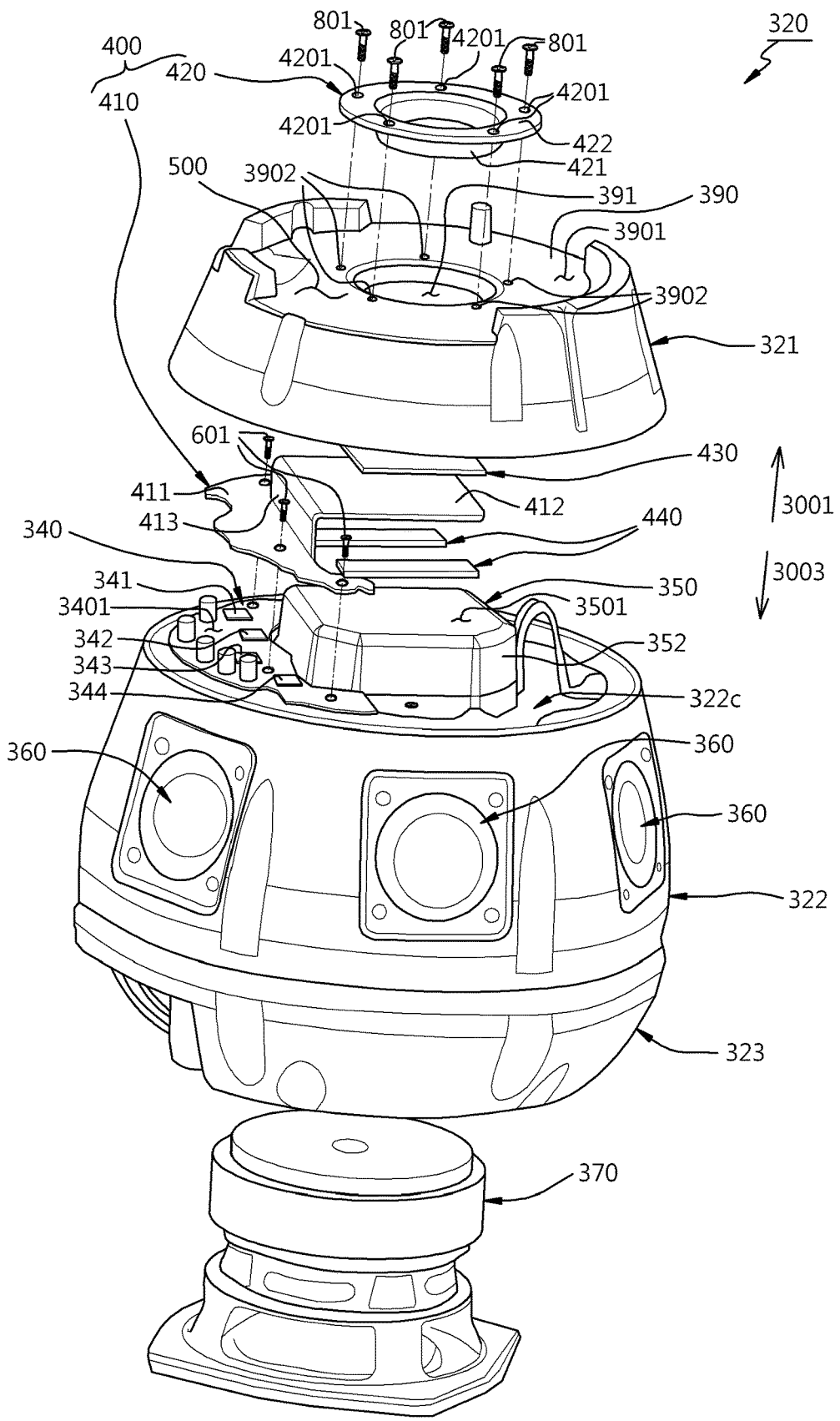
FIG. 5 is an exploded perspective view of a speaker structure including the heat radiating structure of FIG. 3.
Figure 6:
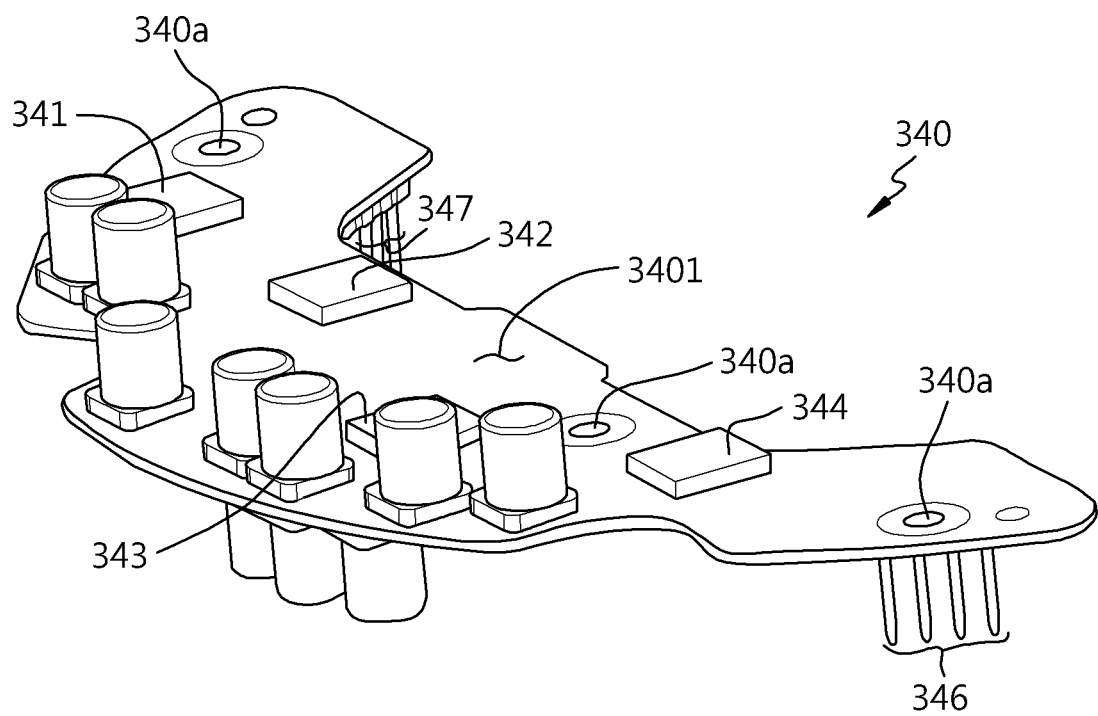
FIG. 6 is a perspective view of a second printed circuit board according to an embodiment.
Figure 7:
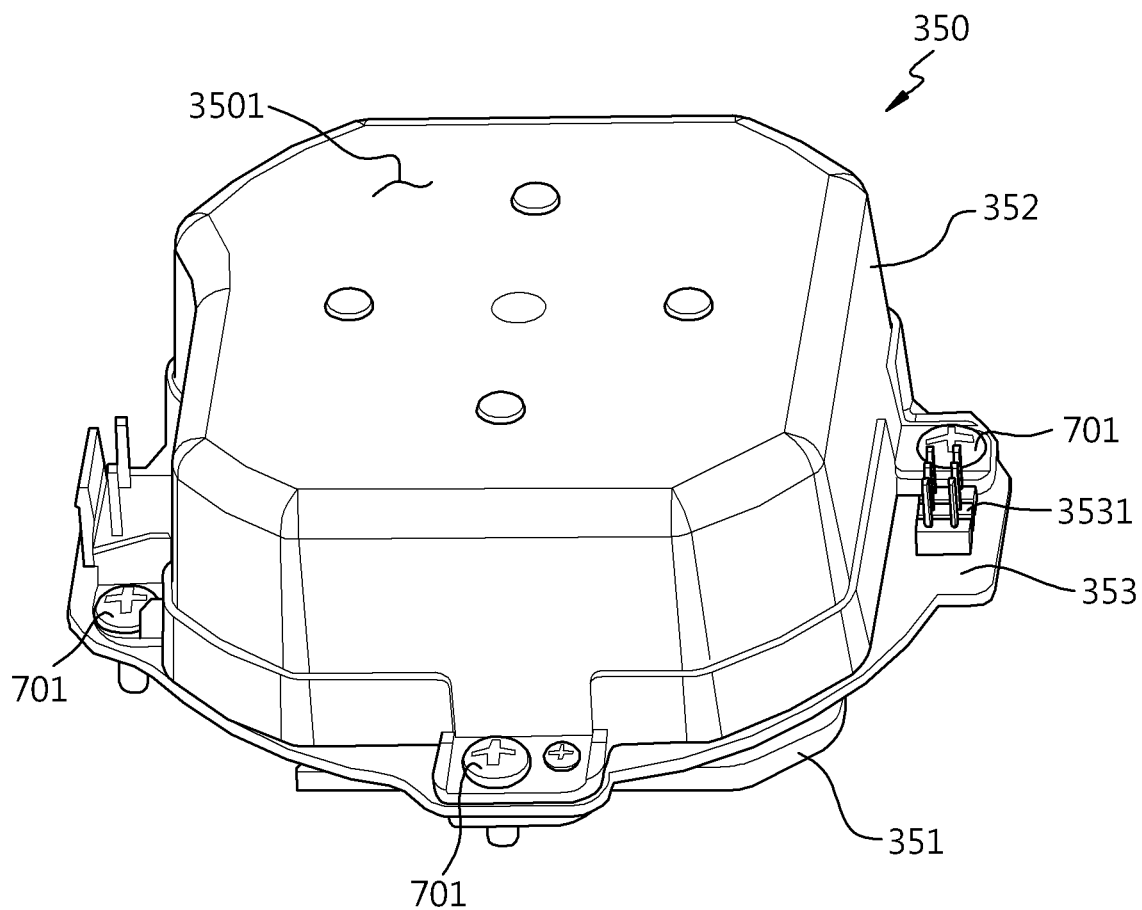
FIG. 7 is a perspective view of a power supply according to an embodiment.
Figure 8:
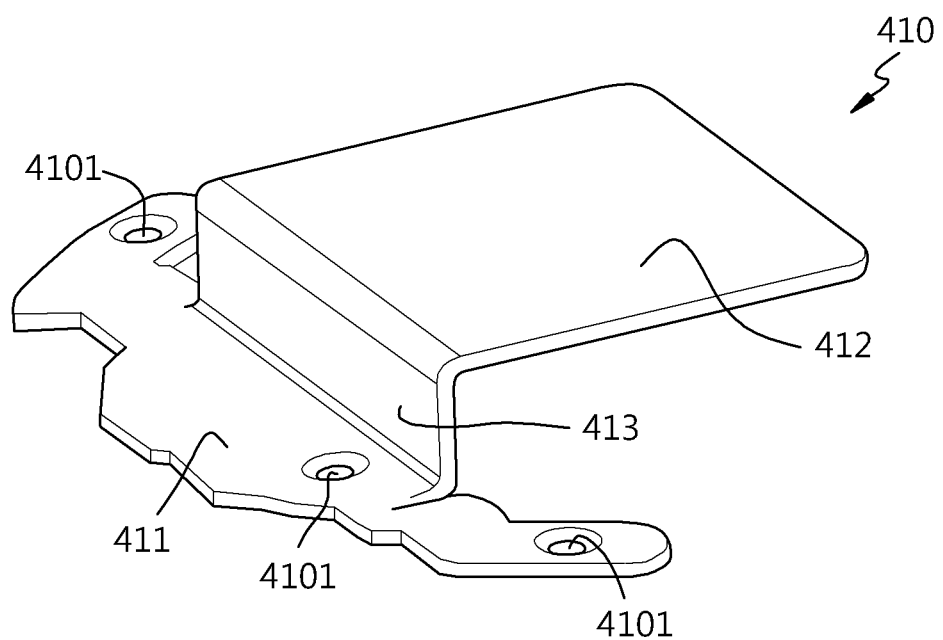
FIG. 8 is a perspective view of a first portion of a thermal conducting member according to an embodiment.
Figure 9:
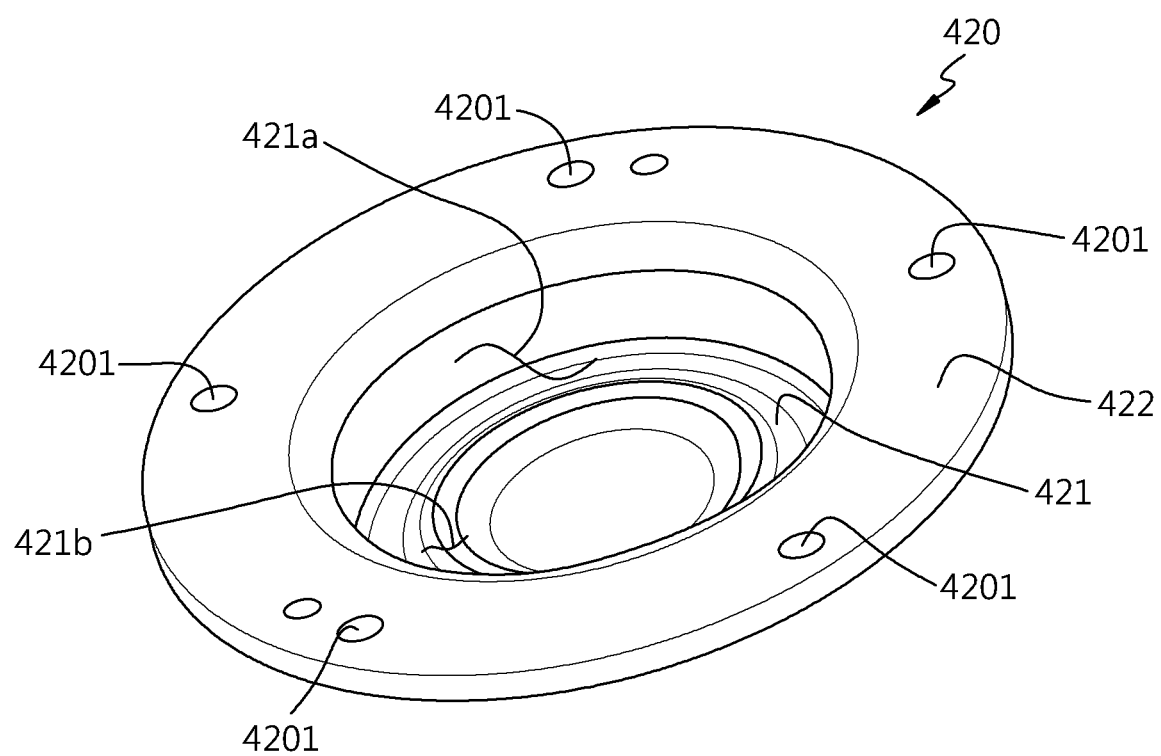
FIG. 9 is a perspective view of a second portion of the thermal conducting member according to an embodiment.

FIG. 5 is an exploded perspective view of the speaker structure 320 including the heat radiating structure of FIG. 3. FIG. 6 is a perspective view of a second printed circuit board according to an embodiment. FIG. 7 is a perspective view of a power supply according to an embodiment. FIG. 8 is a perspective view of a first portion of a thermal conducting member according to an embodiment. FIG. 9 is a perspective view of a second portion of the thermal conducting member according to an embodiment.

Referring to FIG. 5, the speaker structure 320 may include at least one of a first structure 321, a second structure 322, a third structure 323, a plurality of first speakers 360, a second speaker 370, a second printed circuit board 340, a power supply 350, a heat conducting member 400, a first thermally conductive member 430 or a second thermally conductive member 440. The first structure 321, the second structure 322, the third structure 323, the plurality of first speakers 360, and the second speaker 370 are substantially the same as those of FIG. 3, and thus, a detailed description thereof is omitted here.

Referring to FIGS. 5 and 6, the second printed circuit board 340 may include one or more amplifiers (or AMP ICs) 341, 342, 343, and 344 related to power or speaker output. The second printed circuit board 340 may include a first surface 3401 opposing the second plate 390 of the first structure 321, and a second surface facing opposite the first surface 3401. The one or more amplifiers 341, 342, 343, and 344 may be arranged on the first surface 3401. The amplifiers are not limited to the number or positions illustrated in FIGS. 5 and 6.

The second structure 322 may include a support member 322c to fix the second printed circuit board 340. The second printed circuit board 340 may include a plurality of penetrating holes 340a, and a plurality of bolts 601 may be inserted into the plurality of penetrating holes 340a to be fastened to the support member 322c. When the second printed circuit board 340 is coupled to the support member 322c by bolt fastening, at least a part of the second printed circuit board 340 may be disposed in a space of the first structure 321.

The second printed circuit board 340 may include a plurality of pins 346 and 347 protruding from the second surface opposing the support member 322c. The speaker structure 320 may include a third printed circuit board disposed between the second printed circuit board 340 and the support member 322c at least in part. The second printed circuit board 340 may be spaced apart from the third printed circuit board in the first direction 3001, and the plurality of pins 346 and 347 of the second printed circuit board 340 may be electrically connected by using a plurality of terminals formed on the third printed circuit board and/or a conductive material such as solder. The third printed circuit board may include a wire to electrically connect the second printed circuit board 340, and the plurality of first speakers 360 and the second speaker 370. The third printed circuit board may include a plurality of penetrating holes aligned with the plurality of penetrating holes 340a of the second printed circuit board 340, and the third printed circuit board may be fixed to the support member 322c along with the second printed circuit board 340 by using the bolts 601.

Referring to FIGS. 5 and 7, the power supply 350 (for example, a switched-mode power supply (SMPS)) may include a printed circuit board 353 in which a circuit for receiving power from a power source and changing a current or voltage characteristic is disposed. The printed circuit board 353 may include a connector 3531 to be electrically connected with an external power source or a speaker 360 or 370. The power supply 350 may include a first metal structure 351 and a second metal structure 352 which are coupled to opposite surfaces of the printed circuit board 353, respectively. The first metal structure 351 is a structure for covering one surface of the printed circuit board 353 facing the second speaker 370 at least in part, and may be spaced apart from the second speaker 370 in the first direction 3001 with the space formed by the second structure 322 and the third structure 323 being sandwiched therebetween. The second metal structure 352 is a structure for covering the other surface of the printed circuit board 353 facing the second plate 390 at least in part, and may have a protruding height to be accommodated in the space of the first structure 321 at least in part. For example, the second metal structure 352 may include a third surface 3501 opposing the second plate 390. The third surface 3501 may be closer to the second plate 390 than the first surface 3401 of the second printed circuit board 340. The first metal structure 351, the second metal structure 352, and the printed circuit board 353 may be fixed to the support member 322c of the second structure 322 by using bolts 701.

When viewed in the third direction 3003, the power supply 350 may be disposed substantially at the center of the second structure 322, and the second printed circuit board 340 may be disposed along at least a part of the periphery of the power supply 350.

According to an embodiment, the second metal structure 352 may be used to protect the printed circuit board 353 and/or a circuitry mounted therein, and also may be used as a medium for transferring heat emitted from the power supply 350 to the thermal conducting member 400.

The thermal conducting member 400 may include a first portion 410 being in contact with at least one component (for example, the second printed circuit board 340, the power supply 350), and/or a second portion 420 which is in contact with the first portion 410 at least in part and is disposed in the second opening 391 formed on the second plate 390. For example, heat emitted from at least one component may be transferred to the second portion 420 through the first portion 410. Heat emitted from at least one component may flow into the second portion 420 through the first portion 410 due to conduction by which heat flows from a high temperature portion to a low temperature portion.

The second plate 390 of the first structure 321 may be spaced apart from the first plate 330 of FIG. 3 in the third direction 3003, and a duct 500 may be formed between the second plate 390 and the first plate 330 as a space or a passage for guiding movement of heat. The second portion 420 may be disposed in the second opening 391 formed on the second plate 390, and one surface of the second portion 420 may be exposed to the duct 500 and may be used as a region for emitting heat to the duct 500.

Referring to FIGS. 5 and 8, the first portion 410 is a medium for transferring heat to the second portion 420, and may include a first region 411 disposed to oppose the first surface 3401 of the second printed circuit board 340, and/or a second region 412 extended from the first region 411 and disposed to oppose the third surface 3501 of the second metal structure 352 of the power supply 350.

The first region 411 may cover the one or more amplifiers 341, 342, 343, and 344 mounted on the first surface 3401 of the second printed circuit board 340, and heat emitted from the one or more amplifiers 341, 342, 343, and 344 may be transferred to the first region 411. A thermal conductive material (for example, a TIM) may be disposed between the first region 411 and the one or more amplifiers 341, 342, 343, and 344, and the thermal conductive material may increase thermal conductivity by increasing a contact area for thermal conduction between the first portion 411 and the one or more amplifiers 341, 342, 343, and 344. The first region 411 may be directly in contact with the one or more amplifiers 341, 342, 343, and 344. The first region 411 may include a flexible conductive material forming at least a part of the surface opposing the one or more amplifiers 341, 342, 343, and 344 in order to guarantee a contact area thereof.

Heat emitted from the third surface 3501 of the second metal structure 352 of the power supply 350 may be transferred to the second region 412 disposed to oppose the third surface 3501. The second thermally conductive member 440 may be disposed between the second region 412 and the third surface 3501, and may increase thermal conductivity by increasing a contact area for thermal conduction between the second region 412 and the third surface 3501. For example, the second thermally conductive member 440 may include a tape including a TIM. The second thermally conductive member 440 may be formed with other various conductive materials. The second region 412 and the third surface 3501 may be directly in contact with each other without the second thermally conductive member 440.

The first portion 410 of the thermal conducting member 400 may include a third region 413 connecting between the first region 411 and the second region 412 which are different in height. Heat emitted from the second printed circuit board 340 may be transferred to the first region 411 and may move to the second region 412 through the third region 413.

The first region 411 may be fixed to the support member 322c, and the second region 412 and the third region 413 may be supported by the first region 411 fixed to the support member 322c and may be fixed at their positions. The first region 411 may be coupled with the second printed circuit board 340 by using the bolts 601. A reference number 4101 is coupling holes.

The first portion 410 of the thermal conducting member 400 may be implemented by using at least one of a heat pipe or a vapor chamber which includes metal such as copper, silver, or aluminum.

When viewed above the second plate 390, the second plate 390 may include the second opening 391 which overlaps the second region 412 of the first portion 410 at least in part or is aligned therewith. The thermal conducting member 400 may include the second portion 420 disposed in the second opening 391, and the second portion 420 may receive heat from the first portion 410.

Referring to FIGS. 5 and 9, the second portion 420 may include a fourth region 421 inserted into the second opening 391 of the second plate 390, and/or a fifth region 422 extended from the fourth region 421 and disposed on one surface 3901 of the second plate 390 opposing the first plate 330. For example, when viewed in the third direction 3003, the second opening 391 may have a circular shape, and the fifth region 422 may have an annular shape extended along the periphery of the second opening 391. The fourth region 421 may protrude in the third direction 3003 to be inserted into the second opening 391 of the circular shape. The second portion 420 may include a space 421a which is concave in the third direction 3003 due to the fourth region 421. When viewed in the third direction 3003, the second opening 391 is not limited to the circular shape and may be formed in various other shapes such as a rectangular shape, and the second portion 420 may be formed in a corresponding shape.

The second plate 390 may include a plurality of holes (for example, penetrating holes) 3902 formed on the periphery of the second opening 391, and the fifth region 422 may include a plurality of penetrating holes 4201 aligned with the plurality of holes 3902. A plurality of bolts 801 may be inserted into the plurality of penetrating holes 4201 of the fifth region 422 and may be fastened to the plurality of holes 4201 of the second plate 390. When the second portion 420 is coupled with the second plate 390 by bolt fastening, the second portion 420 may block the second opening 391 of the second plate 390, thereby contributing forming of a sealed inner space of the speaker structure 320. An adhesive material or a flexible material may further be disposed between the fifth region 422 and the second plate 390, such that sealing can be achieved between the fifth region 422 and the second plate 390.

The first thermally conductive member 430 may be disposed between the fourth region 421 of the second portion 420 and the second region 412 of the first portion 410, and may increase thermal conductivity by increasing a contact area for thermal conduction between the fourth region 421 and the second region 412. For example, the first thermally conductive member 430 may include a tape including a TIM. The first thermally conductive member 430 may formed with various other conductive materials. The fourth region 421 and the second region 412 may be directly in contact with each other without the first thermally conductive member 430.

The fourth region 421 and/or the fifth region 422 of the second portion 420 may include a shape to increase a contact area with the air in the duct 500. For example, a surface 421b of the fourth region 421 contacting the air in the duct 500 (for example, a space between the first plate 330 of FIG. 3 and the second plate 390 of FIG. 5) may be formed to include a convex-concave portion (for example, an embossed surface), and accordingly, a contact area with the air in the duct 500 may increase, thereby increasing thermal conductivity.

The first portion 410 and the second portion 420 of the thermal conducting member 400 may be formed with different materials. The first portion 410 and the second portion 420 of the thermal conducting member 400 may be formed with the same material. The first portion 410 and the second portion 420 of the thermal conducting member 400 may be integrally formed with each other, and may include the same material.

A speaker may vibrate when outputting sound, and this vibration may be transferred to the speaker structure 320. The vibration of the speaker structure 320 in the housing 201 may enhance the performance of discharging heat from the second portion 420 of the thermal conducting member to the first openings 2102.

When at least one of the plurality of first speakers 360 or the second speaker 370 outputs sound, the speaker structure 320 may vibrate within the housing 201. The vibration of the speaker structure 320 may enhance the performance of discharging heat from the second portion 420 of the thermal conducting member 400 to the duct 500. For example, convective heat transfer which is a method for transferring energy between a solid surface and gas may act between the second portion 420 of the thermal conducting member 400 and the air in the duct 500. The vibration of the speaker structure 320 may cause a motion (or movement) of the air in the duct 500, thereby enhancing convective heat transfer performance between the second portion 420 of the thermal conducting member 400 and the air in the duct 500.

Figure 10:
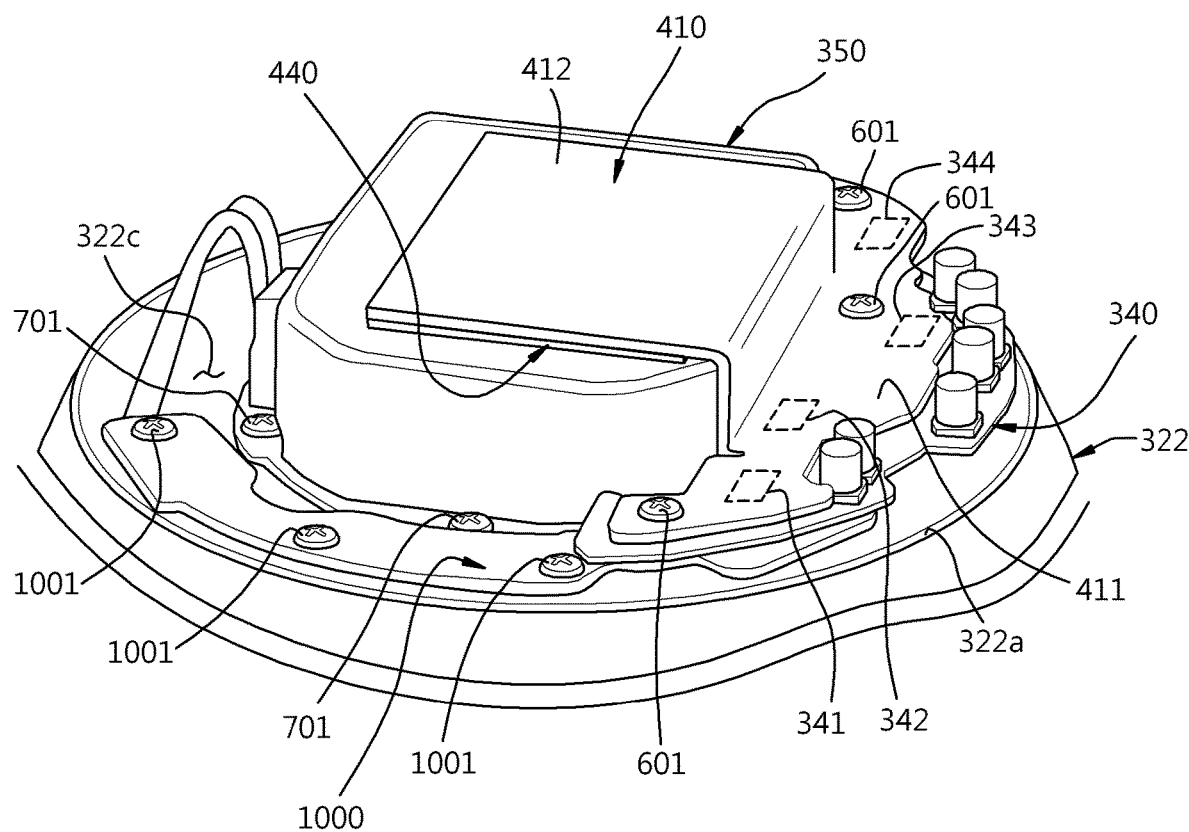
FIG. 10 is a view illustrating a second structure, a second printed circuit board, a power supply, a first portion, a second thermally conductive member, and a third printed circuit board according to an embodiment.

FIG. 10 illustrates the second structure, the second printed circuit board, the power supply, the first portion, the second thermally conductive member, and a third printed circuit board according to an embodiment.

Referring to FIG. 10, the power supply 350 may be coupled with the support member 322c of the second structure 322 by using the plurality of bolts 701. The second printed circuit board 340 may be coupled to the support member 322c of the second structure 322 by using the plurality of bats 601 in a region between the edge 322a of the second structure 322 and the power supply 350. The first region 411 of the first portion 410 may be disposed to overlap the second printed circuit board 340 at least in part, and the first region 411 may be coupled with the support member 322c of the second structure 322 along with the second printed circuit board 340 by using the plurality of bolts 601. The second region 412 of the first portion 410 may be extended from the first region 411 and may be in contact with the third surface 3501 of the power supply 350. The second thermally conductive member 440 may be disposed between the second region 412 and the third surface 3501 of the power supply 350. Heat emitted from at least one component (for example, the amplifiers 341, 342, 343, and 344) of the second printed circuit board 340 may be transferred to the second region 412 through the first region 411. Heat emitted from the power supply 350 may be transferred to the second region 412.

At least a part of the third printed circuit board 1000 may be disposed between the support member 322c and the second printed circuit board 340. The third printed circuit board 1000 may be coupled with the support member 322c by using a plurality of bolts 1001. The third printed circuit board 1000 may electrically connect the plurality of first speakers, and/or the second speaker with the second printed circuit board 340. The amplifier 341, 342, 343 or 344 mounted on the second printed circuit board 340 may provide electric energy (for example, a current) to the speaker through the third printed circuit board 1000. The third printed circuit board 1000 may reduce the length of a wire between the plurality of speakers and the second printed circuit board 340, and accordingly, an electromagnetic influence (for example, an electromagnetic noise) of the wire on other elements (for example, an antenna) may be reduced.

Figure 11:
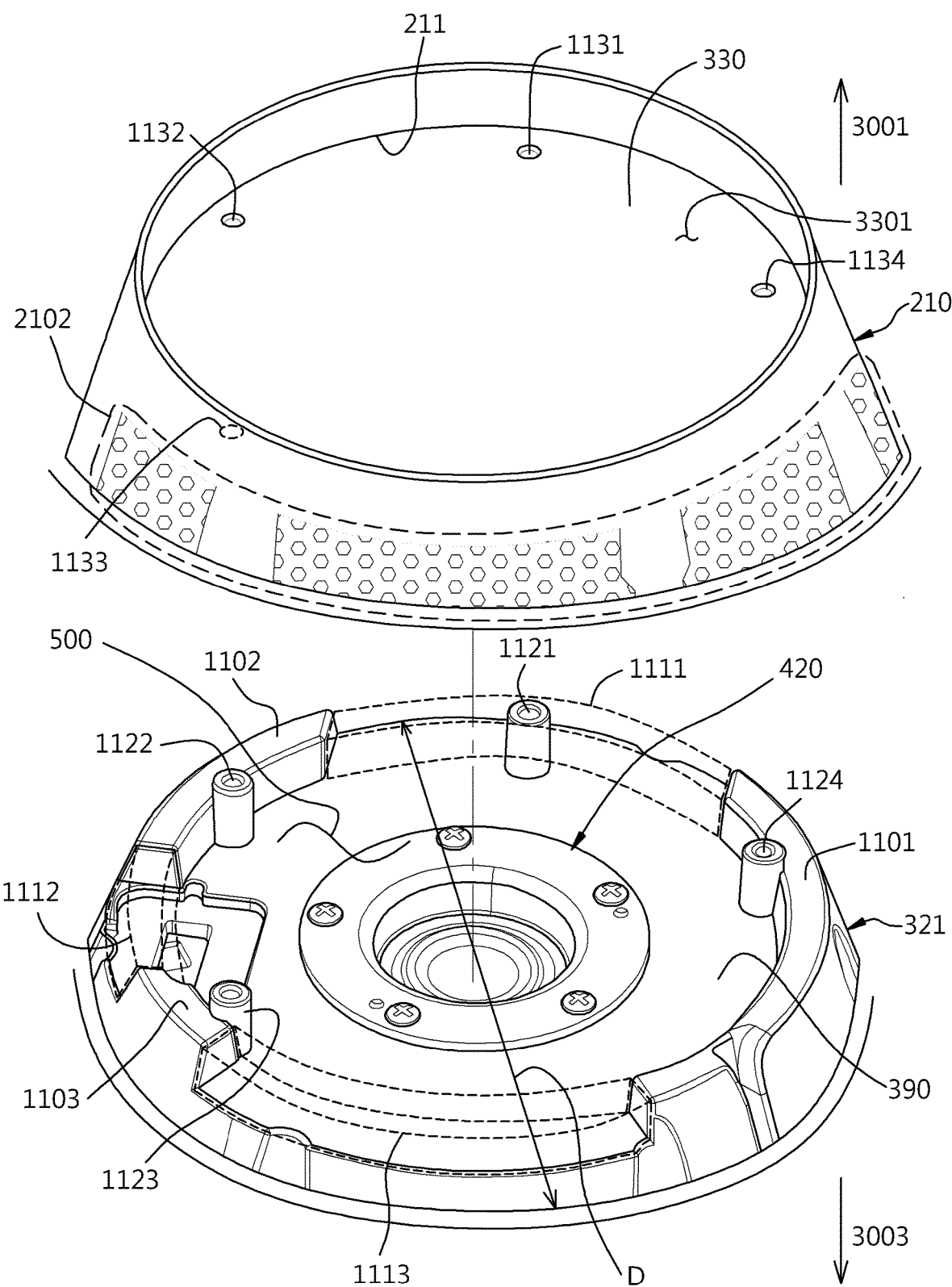
FIG. 11 is a view illustrating a first structure, a second portion of a thermal conducting member, and a first exterior member.

FIG. 11 illustrates the first structure, the second portion of the thermal conducting member, and the first exterior member according to an embodiment.

Referring to FIG. 11, the first exterior member 210 may include the first plate 330 extended from the first edge 211 and disposed above the first structure 321. The first plate 330 may include a surface 3301 facing in the first direction 3001, and a surface facing in the third direction 3003 opposite to the first direction 3001 and opposing the first structure 321.

The first structure 321 may include the second plate 390 opposing the first plate 330. When the first exterior member 210 and the first structure 321 are disposed at set positions, the first plate 330 and the second plate 390 may form the duct 500 which is a space directed toward the first openings 2102. The first structure 321 may include a plurality of sidewalls 1101, 1102, and 1103 protruding from a border region of the second plate 390 in the first direction 3001 along the circumference of the first exterior member 210. When the first exterior member 210 and the second structure 321 are disposed at set positions, the plurality of sidewalls 1101, 1102, and 1103 may come into contact with the first plate 330, and second spaces 1111, 1112, and 1113 between the plurality of sidewalls 1101, 1102, and 1103 adjacent to the first openings 2102 may be utilized as exits to allow the air receiving heat from the second portion 420 to be discharged to the first openings 2102 from the duct 500, The plurality of sidewalls 1101, 1102, and 1103 may support the first plate 330 and the second plate 390 to be spaced apart from each other.

The first structure 321 may include a plurality of bosses 1121, 1122, 1123, and 1124 protruding from the second plate 390 in the first direction, and the first plate 330 may include a plurality of penetrating holes 1131, 1132, 1133, and 1134 aligned with the plurality of bosses 1121, 1122, 1123, and 1124. A plurality of bolts may be inserted into the plurality of penetrating holes 1131, 1132, 1133, and 1134 to be fastened to the plurality of bosses 1121, 1122, 1123, and 1124. When the first plate 330 and the first structure 321 are coupled to each other by bolt fastening, the plurality of sidewalls 1101, 1102, and 1103 may be in close contact with the first plate 330. In replacement of the plurality of bosses 1121, 1122, 1123, and 1124 and the plurality of penetrating holes 1131, 1132, 1133, and 1134, various types of coupling structures (for example, press-fitting structures) extending from the second plate 390 in the first direction 3001 to be coupled with one surface of the first plate 330 opposing the second plate 390 may be provided.

An elastic member (for example, rubber) disposed between the plurality of sidewalls 1101, 1102, and 1103 and the first plate 330 may further be provided. The elastic member may elastically press the first plate 330 between the plurality of sidewalls 1101, 1102, and 1103 and the first plate 330. The elastic member may seal between the plurality of sidewalls 1101, 1102, and 1103 and the first plate 330, thereby allowing the air receiving heat from the second portion 420 to be discharged through the second spaces 1111, 1112, and 1113 between the plurality of sidewalls 1101, 1102, and 1103 substantially adjacent to the first openings 2102.

According to an embodiment, the plurality of sidewalls 1101, 1102, and 1103 may reduce a movement cross-sectional area through which the air passes when the air moves to the first openings 2102 from the duct 500, and thus heat discharging performance may be enhanced. For example, the duct 500 may include a first space surrounded by the plurality of sidewalls 1101, 1102, and 1103, and the second spaces 1111, 1112, and 1113 connecting with the first space and formed between the plurality of sidewalls 1101, 1102, and 1103 adjacent to the first openings 2102. The second spaces 1111, 1112, and 1113 may have volumes less than the first space. When the air moves from the first space to the outside through the second spaces 1111, 1112, and 1113, a flow velocity may increase in the second spaces 1111, 1112, and 1113. The duct 500 having a structure by which a movement cross-sectional area of an exit, through which the air escapes, is reduced may allow the air receiving heat from the second portion 420 to be more rapidly discharged to the outside.

The sidewalls for reducing the movement cross-sectional area of the exit through which the air escapes are not limited to the number and positions illustrated in FIG. 11. The sidewalls for reducing the movement cross-sectional area of the exit through which the air escapes may be formed in the first exterior member 210.

The second plate 390 may be a circular plate having a diameter D, and, when viewed in the third direction 3003, the second portion 420 may be disposed substantially at the center of the second plate 390. The second portion is not limited to the position illustrated in FIG. 11.

At least a part of the first structure 321 (for example, the second plate 390 or the sidewalls 1101, 1102, and 1103) may be used as a heat radiating member (for example, a heat radiating plate) which receives heat from the second portion 420 and absorbs the heat.

Figure 12:
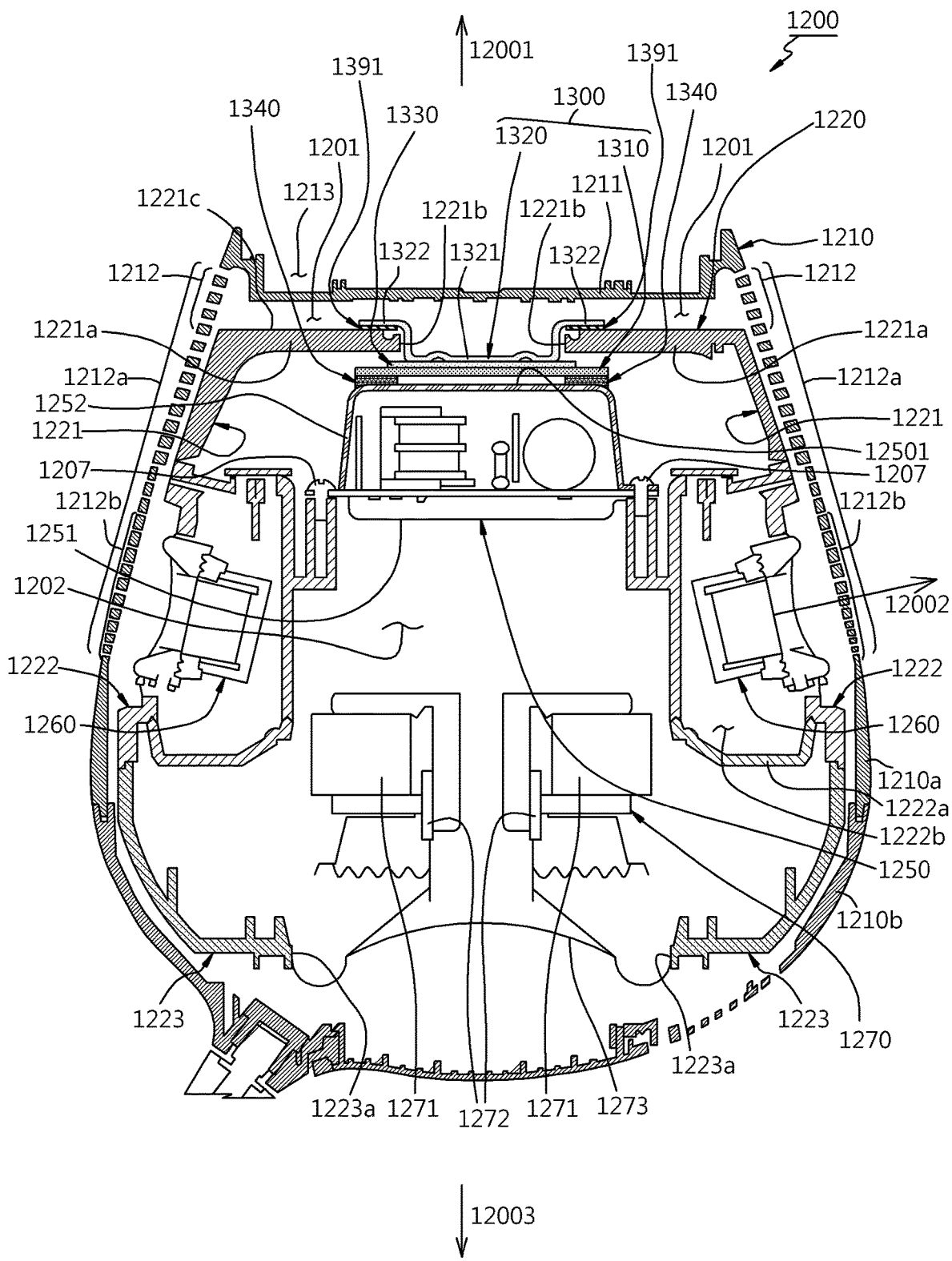
FIG. 12 is a cross-sectional view of an electronic device including a heat radiating structure according to an embodiment.
Figure 13:
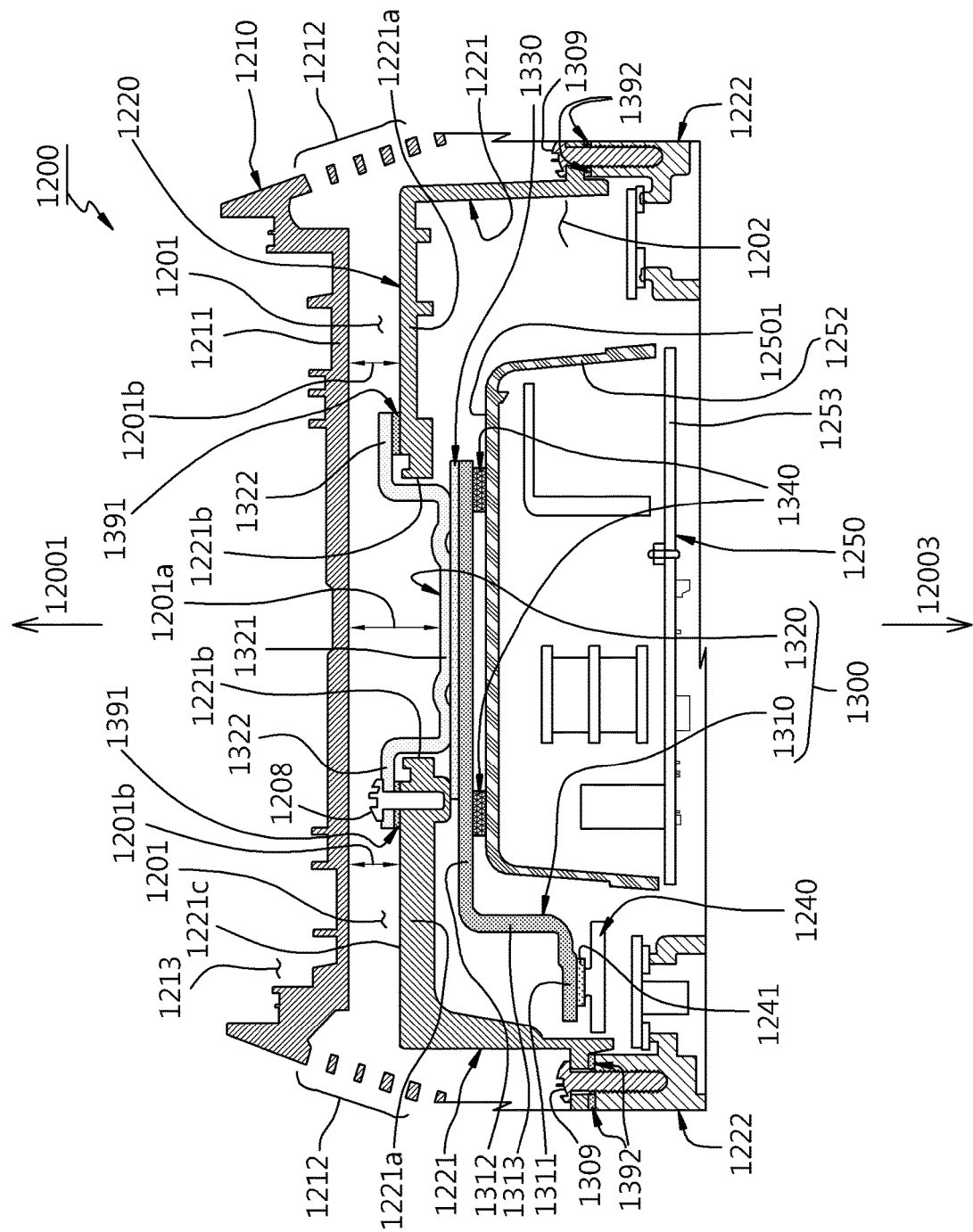
FIG. 13 is a cross-sectional view of an electronic device including a heat radiating structure according to an embodiment.

FIGS. 12 and 13 are cross-sectional views of an electronic device 1200 including a heat radiating structure according to an embodiment.

Referring to FIGS. 12 and 13, the electronic device 1200 may include a housing 1210 and a speaker structure 1220 disposed within the housing 1210.

The housing 1210 may include, as a member forming at least a part of an exterior of the electronic device 1200, a first plate 1211, and at least one first opening 1212. The housing 1210 may include a first exterior member 1210a and/or a second exterior member 1210b. The first exterior member 1210a may include a plurality of penetrating holes 1212a. The plurality of penetrating holes 1212a may include the first opening 1212. The plurality of penetrating holes 1212a may overlap one or more first speakers 1260, and may be used as sound discharge holes. Since the first exterior member 1210a and the second exterior member 1210b are substantially the same as those of FIG. 3, a detailed description thereof is omitted here.

The first exterior member 1210a may include a recess 1213 formed by the first plate 1211. The recess 1213 may be used as a space in which the first printed circuit board 310 including the plurality of microphones of FIG. 3, the third exterior member 230 including the plurality of mic holes, and/or the fourth exterior member 240 including the plurality of penetrating holes are arranged.

The speaker structure 1220 may include a first structure 1221 which forms a space 1201 (hereinafter, the duct) connecting to the first opening 1212 along with the first plate 1211. The first structure 1221 may include a second plate 1221a facing in a first direction 12001 and opposing the first plate 1211. The second plate 1221a may be spaced apart from the first plate 1211 with the duct 1201 being formed therebetween.

The speaker structure 1220 may include a second opening 1221b formed by penetrating through a part of the first structure 1221. The second opening 1221b may be formed on the second plate 1221a, and may connect the duct 1201 formed over the second plate 1221a and a space 1202 of the speaker structure 1220.

The speaker structure 1220 may include at least one component disposed in the space 1202 of the speaker structure 1220 and emitting heat. The at least one component may include at least one amplifier 1241, or a second printed circuit board 1240 having the amplifier mounted thereon. The at least one component may include, as a circuitry or a structure related to power, a power supply 1250 receiving power from a power source and changing a current or voltage characteristic (for example, converting AC power into DC power).

The speaker structure 1220 may include a heat radiating structure to discharge heat emitted from at least one component (for example, the second printed circuit board 1240 and/or the power supply 1250) to the first opening 1212 through the duct 1201. The speaker structure 1220 may include a thermal conducting member 1300 which includes a first portion 1310 (for example, the first portion 410 of FIG. 5 or 8) disposed in the space 1202 of the speaker structure 1220 and being in contact with the at least one component (for example, the second printed circuit board 1240 and/or the power supply 1250), and a second portion 1320 disposed in the second opening 1221b. At least a part of the heat emitted from the at least one component (for example, the second printed circuit board 1240 and/or the power supply 1250) may be transferred to the second portion 1320 through the first portion 1310. The heat transferred to the second portion 1320 may be transferred to the air in the duct 1201 by convective heat transfer, and the air receiving the heat may move along the duct 1201 and may be discharged to the outside through the first opening 1212.

The first portion 1310 and the second portion 1320 may be formed separately from each other, and may be directly or indirectly in contact with each other in the second opening 1221*b* or at a position adjacent to the second opening 1221*b*.

The first portion 1310 of the thermal conducting member 1300 may include a first region 1311 being in contact with the second printed circuit board 1240 at least in part, and a second region 1312 being in contact with the power supply 1250 at least in part.

The power supply 1250 may include a printed circuit board 1253 in which a circuitry for receiving power from a power source and changing a current or voltage characteristic is disposed, and at least one of a first metal structure 1251 or a second metal structure 1252 coupled to opposite surfaces of the printed circuit board 1253, respectively. The first metal structure 1251 may cover one surface of the printed circuit board 1253 that faces in a third direction 12003 at least in part. The second metal structure 1252 may cover the other surface of the printed circuit board 1253 that faces in the first direction 12001 at least in part, and may have a height protruding in the first direction 12001. For example, the second metal structure 1252 may include a third surface 12501 opposing the second plate 1221*a*.

The second printed circuit board 1240 may be disposed on the periphery of the power supply 1250, and the third surface 12501 of the power supply 1250 may be closer to the second plate 1221*a* than the second printed circuit board 1240. The first portion 1310 of the thermal conducting member 1300 may include a third region 1313 connecting between the first region 1311 and the second region 1312. Heat emitted from the second printed circuit board 1240 may be transferred to the first region 1311 and may move to the second region 1312 through the third region 1313.

The speaker structure 1220 may include a second thermally conductive member 1340 disposed between the third surface 12501 of the power supply 1250 and the second region 1312 of the first portion 1310. The second thermally conductive member 1340 may increase thermal conductivity by increasing a contact area for thermal conduction between the third surface 12501 of the power supply 1250 and the second region 1312 of the first portion 1310. The third surface 12501 of the power supply 1250 and the second region 1312 of the first portion 1310 may be directly in contact with each other without the second thermally conductive member 1340, and may conduct heat.

The second portion 1320 of the thermal conducting member 1300 may include a fourth region 1321 inserted into the second opening 1221*b*, and a fifth region 1322 extended from the fourth region 1321 and disposed on one surface 1221*c* of the second plate 1221*a* that opposes the first plate 1211. The fourth region 1321 may reduce a spacing distance from the second region 1312 of the first portion 1310 disposed in the space 1202 of the speaker structure 1220, thereby guaranteeing a heat transfer area for the second region 1312, and may also enhance convective heat transfer performance by increasing a contact area with the air in the duct 1201.

The second portion 1320 may block the second opening 1221*b* and may contribute to forming of a sealed inner space of the speaker structure 1220. An adhesive material or a flexible material may further be disposed between the fifth region 1322 and the second plate 1221*a*, such that sealing can be achieved between the fifth region 1322 and the second plate 1221*a*.

The speaker structure 1220 may include a first thermally conductive member 1330 disposed between the first portion 1310 and the second portion 1320 of the thermal conducting member 1300. The first thermally conductive member 1300 may increase thermal conductivity by increasing a contact area for thermal conduction between the first portion 1310 and the second portion 1320. The first portion 1310 and the second portion 1320 may be directly in contact with each other without the first thermally conductive member 1330 and may conduct heat.

The speaker structure 1220 may include a thermally conductive member (for example, a TIM) disposed between the second printed circuit board 1240 and the first region 1311 of the first portion 1310. For example, the thermally conductive member may increase thermal conductivity by increasing a contact area for thermal conduction between at least one amplifier 1241 and the first region 1311 of the first portion 1310. The at least one amplifier 1241 and the first region 1311 of the first portion 1310 may be directly in contact with each other without the thermally conductive member, and may conduct heat.

The first portion 1310 and the second portion 1320 of the thermal conducting member 1300 may be integrally formed with each other, and may include the same material.

The speaker structure 1220 may include one or more first speakers 1260 which are directed in a second direction 12002 that forms an angle ranging from about 45 to 135 degrees with respect to the first direction 12001.

The speaker structure 1220 may include a second speaker 1270 disposed in the third direction 12003 opposite to the first direction 12001.

The speaker may vibrate when outputting sound, and this vibration may be transferred to the speaker structure 1220. The vibration of the speaker structure 1220 in the housing 1210 may enhance the performance of discharging heat from the second portion 1320 of the thermal conducting member 1300 to the first opening 1212. For example, convective heat transfer which is a method for transferring energy between a solid surface and gas may act in the air in the duct from the second portion 1320 of the thermal conducting member 1300. The vibration of the speaker structure 1320 may cause a motion (or movement) of the air in the duct 1201, thereby, enhancing convective heat transfer performance between the second portion 1320 of the thermal conducting member 1300 and the air in the duct 1201. For example, the vibration of the speaker structure 1320 may cause a forced convection using a means for causing movement of a fluid like a pump. Various structures for discharging heat emitted from at least one component (for example, the second printed circuit board 1240, the power supply 1250) to the first opening 1212 through the duct 1201 may be designed in consideration of the vibration of the speaker structure 1320 and a movement characteristic of the air (for example, a movement velocity, a movement direction, etc.) in the duct by the vibration.

The speaker structure 1220 may include a second structure 1222 and a third structure 1223 which are coupled with the first structure 1221 to form the space 1202 of the speaker structure 1220 with the first structure 1221. The second structure 1222 may include an inner structure 1222*a* formed of partition walls to provide a sealed space 1222*b* corresponding to the one or more speakers 1260. The one or more speakers 1260 may output sound by using the space 1222*b* provided in the inner structure 1222*a*.

The third structure 1223 may include an opening 1223*a*. The second speaker 1270 may be coupled to the opening 1223*a*, and a vibration plate 1273 of the second speaker 1270 may be directed in the third direction 12003. When the second speaker 1270 outputs sound, a coil 1272 may move in the first direction 12001 or the third direction 12003 by an interaction between a magnetic field generated in the coil 1272 and a magnet 1271, and the vibration plate 1273 connected to the coil 1272 may vibrate. The vibration of the second speaker 1270 may be transferred to the second structure 1222 and/or the first structure 1221 through the third structure 1223. The vibration of the first structure 1221 caused by the second speaker 1270 may be transferred to the second portion 1320 of the thermal conducting member 1300 coupled with the first structure 1221. The vibration of the second portion 1320 may cause a motion (or movement) of the air in the duct 1201, thereby enhancing convective heat transfer performance between the second portion 1320 and the air in the duct 1201.

The one or more first speakers 1260 may vibrate and output sound substantially in the same method as the second speaker 1270. The vibration of the one or more first speakers 1260 may be transferred to the first structure 1221 and/or the third structure 1223 through the inner structure 1222*a*. The vibration of the first structure 1221 caused by the one or more first speakers 1260 may be transferred to the second portion 1320 of the thermal conducting member 1300 coupled with the first structure 1221. The vibration of the second portion 1320 of the thermal conducting member 1300 may cause a motion (or movement) of the air in the duct 1201, thereby enhancing convective heat transfer performance between the second portion 1320 and the air in the duct 1201.

The duct 1201 may include a first space 1201*a* formed between the first plate 1211 and the fourth region 1321 of the second portion 1320, and a second space 1201*b* formed between the first plate 1211 and one surface 1221*c* of the second plate 1221*a*. The first space 1201*a* may have a greater volume in the third direction 12003 than the second space 1201*b*. The second space 1201*b* may reduce a movement cross-sectional area through which the air to be moved from the duct 1201 to the first opening 1212 passes. For example, when the air moves to the outside by passing through the second space 1201*b* from the first space 1201*a*, a flow velocity may increase in the second space 1201*b*. The duct 1201 having a structure by which the movement cross-sectional area of an exit through which the air escapes is reduced may allow the air receiving heat from the second portion 1320 to be more rapidly discharged to the outside.

The second space 1201*b* of the duct 1201 may be extended in parallel with the first plate 1211 and/or the second plate 1221*a*, and this may reduce a moving path of the air, thereby enhancing heat discharge performance.

One surface 1221*c* of the second plate 1221*a* opposing the first plate 1211 may be substantially planar. This is a structure that does not hinder the movement of the air and thus can enhance heat discharge performance. A surface of the first plate 1211 opposing the second plate 1221*a* may be substantially planar.

An elastic member 1391 may be disposed between the fifth region 1322 of the second portion 1320 and one surface 1221*c* of the second plate 1221*a*. The elastic member 1391 may be elastically disposed between the second plate 1221*a* and the fifth region 1322 to seal between the second plate 1221*a* and the fifth region 1322. In the vibration of the speaker structure 1220, the fifth region 1322 may be elastically supported by the elastic member 1391, and thus may vibrate on the second plate 1221*a* at a relatively higher frequency. Accordingly, the convective heat transfer performance between the second portion 1320 and the air in the duct 1201 may be enhanced. An elastic member such as a compression spring may be used as long as set heat discharge performance is guaranteed even when sealing is not achieved between the second plate 1221*a* and the fifth region 1322. The elastic member 1391 may reduce a noise caused by the vibration of the speaker structure 1200. The elastic member 1391 may be omitted.

The first structure 1221 and the second structure 1222 may be coupled to each other by using one or more bolts 1309. An elastic member 1392 may be interposed in a coupling portion using one or more bolts 1309 between the first structure 1221 and the second structure 1222. The elastic member 1392 may be elastically disposed between the first structure 1221 and the second structure 1222 to seal between the first structure 1221 and the second structure 1222. In the vibration of the speaker structure 1220, the first structure 1221 coupled with the second portion 1320 may be elastically supported by the elastic member 1392 and may vibrate with respect to the second structure 1222 at a relatively higher frequency. Accordingly, convective heat transfer performance between the second portion 1320 and the air in the duct 1201 may be enhanced. An elastic member such as a compression spring may be used as long as set heat discharge performance is guaranteed even when sealing between the first structure 1221 and the second structure 1222 is not achieved. The elastic member 1392 may reduce a noise caused by the vibration of the speaker structure 1200. The elastic member 1392 may be omitted.

Figure 14:
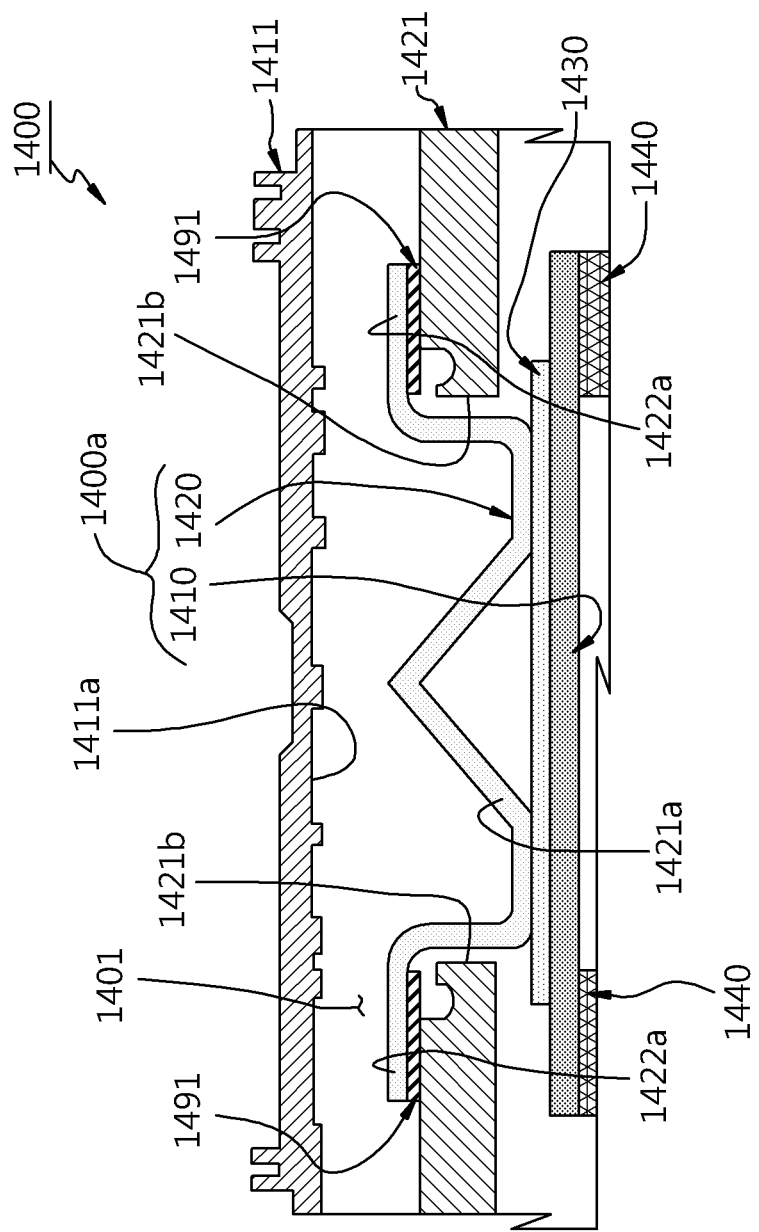
FIG. 14 is a cross-sectional view of an electronic device including a heat radiating structure according to an embodiment.

FIG. 14 is a cross-sectional view of an electronic device 1400 including a heat radiating structure according to an embodiment.

Referring to FIG. 14, the electronic device 1400 may include at least one of a first plate 1411, a first structure 1421, a second opening 1421*b*, a thermal conducting member 1400*a*, a first thermally conductive member 1430, a second thermally conductive member 1440, or an elastic member 1491. The first plate 1411, the first structure 1421, the second opening 1421*b*, the first thermally conductive member 1430, the second thermally conductive member 1440, and the elastic member 1491 are substantially the same as those of FIG. 12 or FIG. 13, and thus a detailed description thereof is omitted here.

The thermal conducting member 1400*a* may include at least one of a first portion 1410 or a second portion 1420. The first portion 1410 is substantially the same as that of FIG. 12 or FIG. 13 and thus a detailed description thereof is omitted here. The second portion 1420 may include a fourth region 1421*a* disposed in the second opening 1421*b*, and a fifth region 1422*a* extended from the fourth region 1421*a* and coupled with the first structure 1421.

The fourth region 1421*a* may be formed to have a shape which is convex toward the first plate 1411 when viewed in cross section. This may increase convective heat transfer performance by increasing a contact area with the air in the second portion 1420 and a duct 1401.

Figure 15:
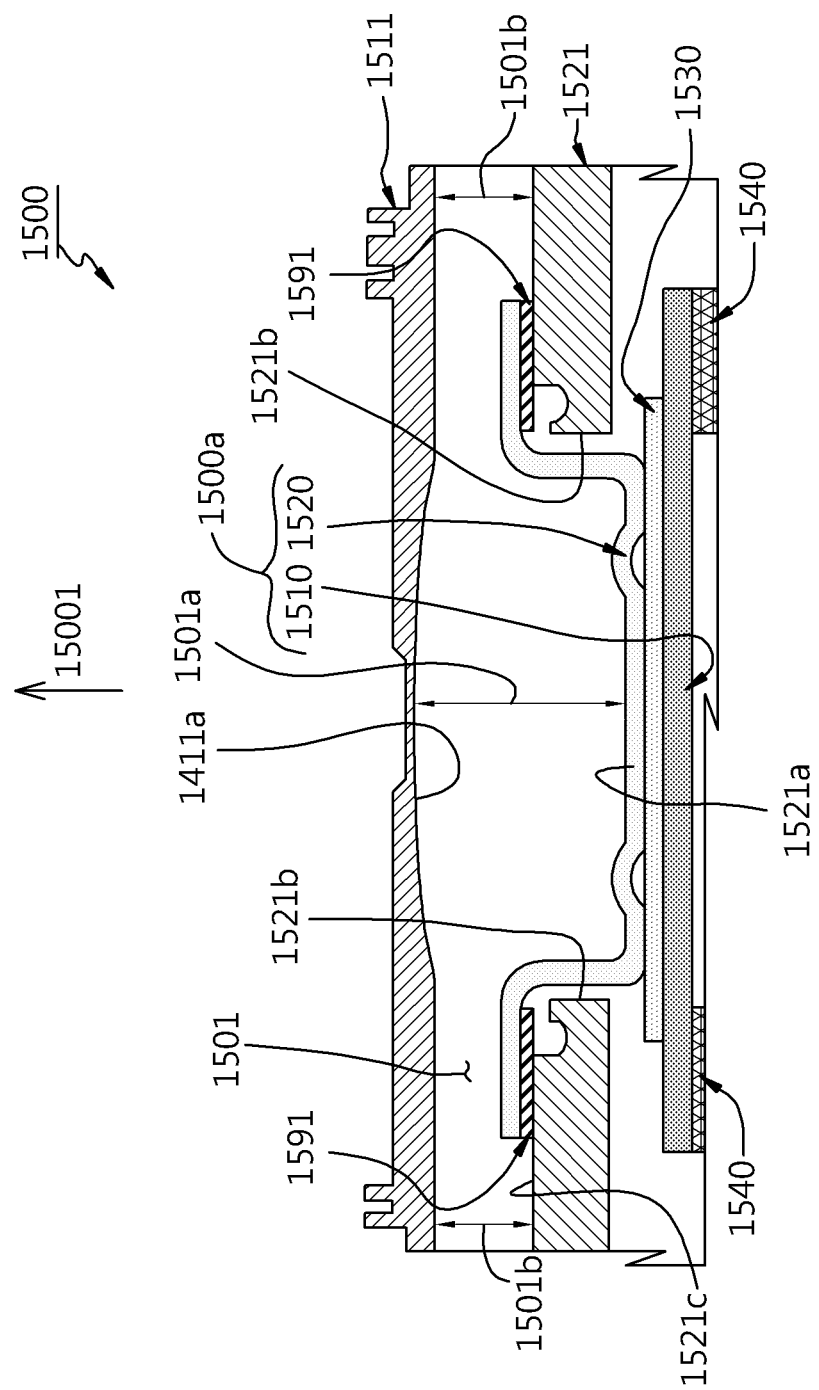
FIG. 15 is a cross-sectional view of an electronic device including a heat radiating structure according to an embodiment.

FIG. 15 is a cross-sectional view of an electronic device 1500 including a heat radiating structure according to an embodiment.

Referring to FIG. 15, the electronic device 1500 may include at least one of a first plate 1511, a first structure 1521, a second opening 1521*b*, a thermal conducting member 1500*a* including a first portion 1510 and a second portion 1520, a first thermally conductive member 1530, a second thermally conductive member 1540, or an elastic member 1591. The first plate 1511, the first structure 1521, the second opening 1521b, the thermal conducting member 1500a, the first thermally conductive member 1530, the second thermally conductive member 1540, and the elastic member 1591 are substantially the same as those of FIG. 12 or FIG. 13, and thus a detailed description thereof is omitted here.

A duct 1501 may include a first space 1501a formed between the first plate 1511 and a fourth region 1521a of a second portion 1520, and a second space 1501b formed between the first plate 1511 and one surface 1521c of the first structure 1521. A surface 1411a of the first plate 1510 that opposes the fourth region 1521a of the second portion 1520 may be formed to be convex in a first direction 15001. The convex shape of the surface 1411a may increase a relative volume ratio between the first space 1501a and the second space 1501b in the first direction 15001, and, accordingly, the air receiving heat from the second portion 1520 may be more rapidly discharged to the outside.

Figure 16:
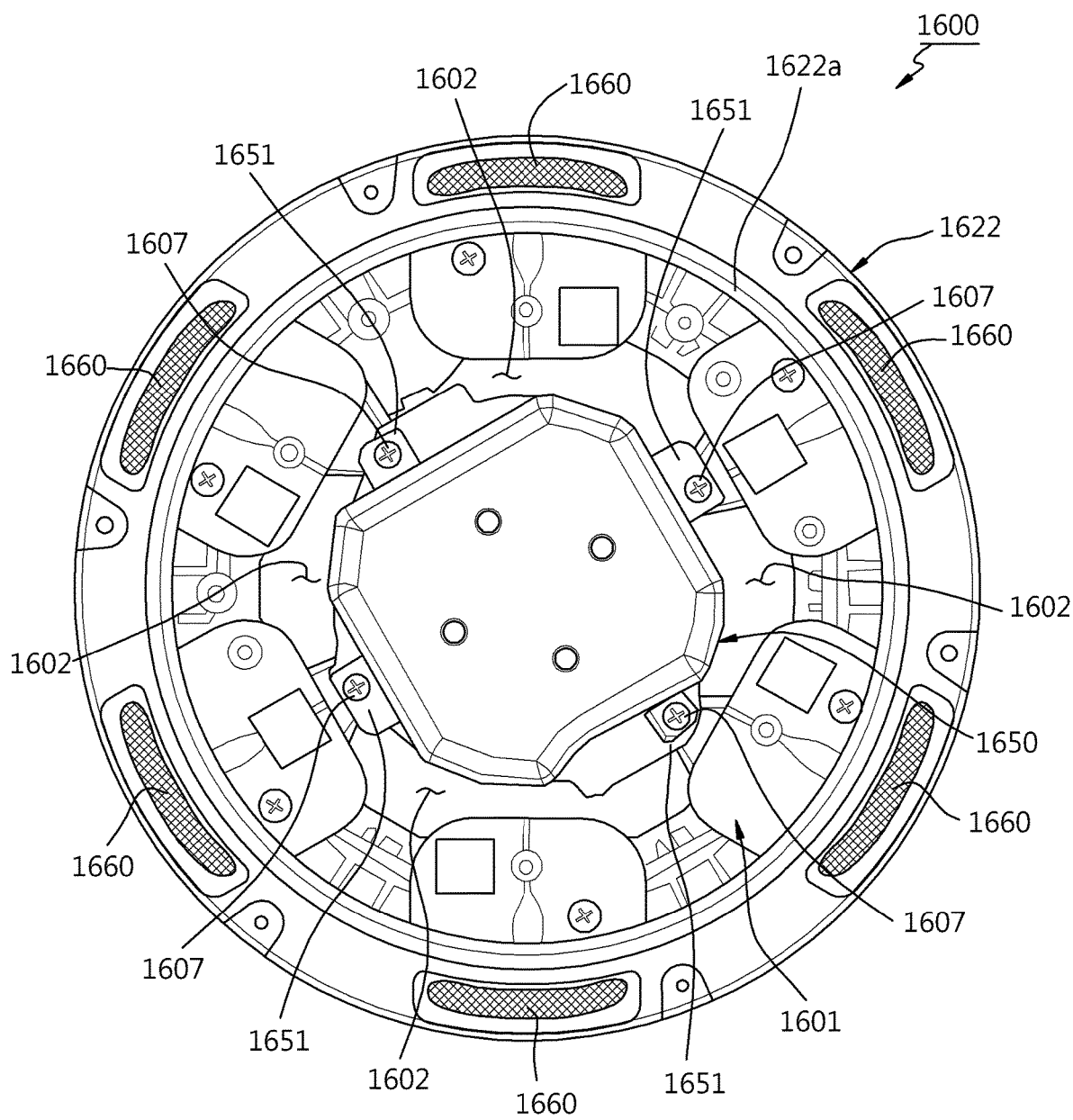
FIG. 16 is a top view of a speaker structure according to an embodiment.
Figure 17:
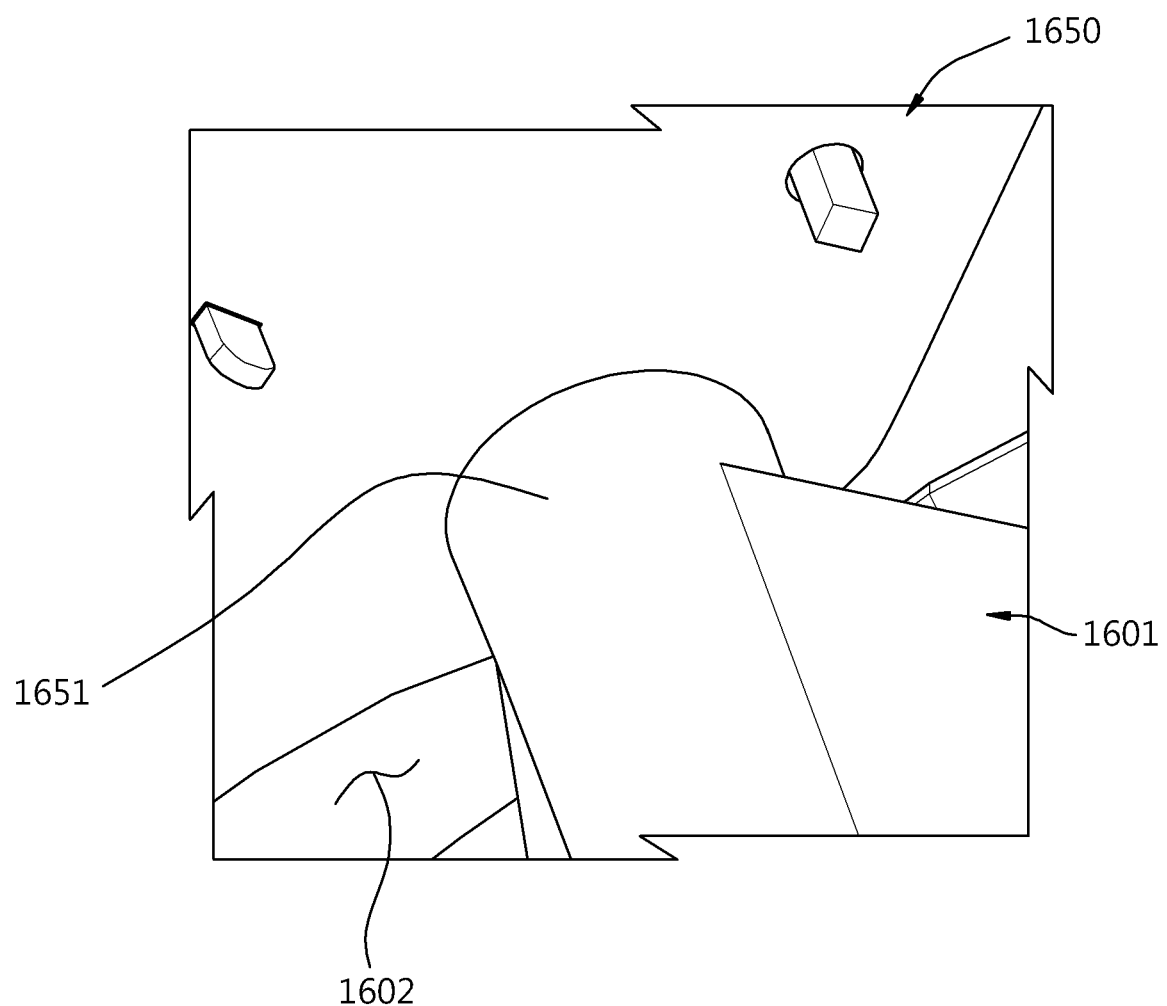
FIG. 17 is a perspective view of a part of the speaker structure of FIG. 16.

FIG. 16 is a top view of a speaker structure 1600 according to an embodiment. FIG. 17 is a perspective view of a part of the speaker structure 1600 of FIG. 16.

Referring to FIGS. 16 and 17, the speaker structure 1600 may include at least one of a plurality of first speakers 1660, a second structure 1622, a support member 1601, or a power supply 1650.

The plurality of first speakers 1660 may be arranged along the circumference of the second structure 1622. The support member 1601 may be disposed on the second structure 1622 to fix the power supply 1650. The support member 1601 may be integrally formed with the second structure 1622, and may include the same material.

When viewed above the second structure 1622 (for example, when viewed in the second direction 3003 of FIG. 5), the support member 1601 may be extended from an inner side 1622a (for example, the edge 322a of FIG. 3) of the second structure 1622, and may be disposed on the periphery of the power supply 1650. For example, the support member 1601 may have an opening 1602 formed therein, and the power supply 1650 may be fixed to the support member 1601 to be aligned with the opening 1602 or to overlap at least in part.

The power supply 1650 may include a plurality of portions 1651 disposed at different positions to be coupled with the support member 1601. The plurality of portions 1651 may be coupled with the support member 1601 on the periphery of the opening 1602 by using a plurality of bolts 1607. The coupling structure of the power supply 1650 and the second structure 1622 may reduce a contact area between the second structure 1622 and the power supply 1650. Accordingly, in the vibration of the speaker structure 1600 caused by sound output from at least one speaker, the vibration of the power supply 1650 on the second structure 1622 may be guaranteed. When the vibration of the power supply 1650 is guaranteed, convective heat transfer performance utilizing a thermal conducting member (for example, the second portion 1320 of FIG. 12) directly or indirectly in contact with the power supply 1650 may also be guaranteed.

According to an embodiment of the present disclosure, an electronic device includes a housing including a first plate and at least one first opening; and a speaker structure spaced apart from the first plate and disposed in the housing. The speaker structure may include a first structure which faces in a first direction, opposes the first plate, and forms a space connecting to the first opening along with the first plate. The speaker structure may include a second opening formed by penetrating through a part of the first structure. The speaker structure may include at least one component disposed in the speaker structure and emitting heat. The speaker structure may include a thermal conducting member including a first portion disposed in the speaker structure and being in contact with the component, and a second portion disposed in the second opening. The speaker structure may include at least one speaker disposed in a direction different from the first direction.

According to an embodiment of the disclosure, the first opening may be formed to be spaced apart from the first plate.

According to an embodiment of the disclosure, the first portion and the second portion may be separately formed, and may be directly or indirectly in contact with each other in the second opening or at a position adjacent to the second opening.

According to an embodiment of the disclosure, the electronic device may further include a first thermally conductive member disposed between the first portion and the second portion.

According to an embodiment of the disclosure, the at least one speaker may include a first speaker which is directed in a second direction forming an angle ranging from 45 to 135 degrees with respect to the first direction.

According to an embodiment of the disclosure, the at least one speaker may include a second speaker disposed in the speaker structure to be directed in a third direction opposite to the first direction.

According to an embodiment of the disclosure, the second speaker may output a sound of a register lower than that of the first speaker.

According to an embodiment of the disclosure, the first portion and the second portion may be integrally formed with each other.

According to an embodiment of the disclosure, the space may be extended in a direction orthogonal to the first direction.

According to an embodiment of the disclosure, the first opening may be adjacent to a plurality of penetrating holes which are formed on the housing to overlap the at least one speaker at least in part.

According to an embodiment of the disclosure, the second portion may include a portion that is convex in a direction opposite to the first direction.

According to an embodiment of the disclosure, the space may include a first space formed between the first plate and the second portion; and a second space formed between the first plate and one surface of the first structure that opposes the first plate.

According to an embodiment of the disclosure, the first space may have a greater volume in the first direction than that of the second space.

According to an embodiment of the disclosure, the second portion further include an extension portion that is disposed on one surface of the first structure opposing the first plate.

According to an embodiment of the disclosure, the electronic device may further include an elastic member disposed between the extension portion and the one surface of the first structure.

According to an embodiment of the disclosure, the second portion may include a concavo-convex surface that opposes the first plate.

According to an embodiment of the disclosure, the at least one component may include a first component being in contact with a first region of the first portion; and a second component being in contact with a second region of the first portion.

According to an embodiment of the disclosure, at least a part of the second region may be directly or indirectly in contact with the second portion.

According to an embodiment of the disclosure, the first component may include a printed circuit board having at least one amplifier mounted thereon. The second component may include a power supply changing a current or voltage characteristic with respect to power supplied from an external source.

According to an embodiment of the disclosure, the electronic device may further include at least one microphone, and the first plate may be disposed between the at least one microphone and the speaker structure.

According to an embodiment of the disclosure, heat emitted from at least one component disposed in the electronic device may be discharged to the outside through convective heat transfer which utilizes a thermal conducting member which is directly or indirectly in contact with the at least one component, and, thus, the at least one component may be prevented from overheating. In addition, the electronic device may guarantee heat radiating performance by utilizing vibration generated when at least one speaker outputs sound.

While the disclosure has been shown and described with reference to certain embodiments thereof, it will be understood by those skilled in the art that various changes in form and details may be made therein without departing from the spirit and scope of the disclosure as defined by the appended claims and their equivalents. Therefore, the scope of the disclosure is defined not by the detailed description of the disclosure but by the appended claims and their equivalents, and all differences within the scope are intended to be construed as being included in the disclosure.

What is claimed is:

1. An electronic device, comprising:
    a housing comprising a first plate and at least one first opening; and
    a speaker structure spaced apart from the first plate and disposed in the housing,
    wherein the speaker structure comprises:
    a first structure which faces in a first direction, opposes the first plate, and forms a space connecting to the at least one first opening along with the first plate;
    a second opening formed by penetrating through a part of the first structure;
    at least one component disposed in the speaker structure and emitting heat;
    a thermal conducting member comprising a first portion disposed in the speaker structure and being in contact with the at least one component, and a second portion disposed in the second opening; and
    at least one speaker disposed in a direction different from the first direction.

2. The electronic device of claim 1, wherein the at least one first opening is formed to be spaced apart from the first plate.

3. The electronic device of claim 1, wherein the first portion and the second portion are separately formed, and are directly or indirectly in contact with each other in the second opening or at a position adjacent to the second opening.

4. The electronic device of claim 3, further comprising a first thermally conductive member disposed between the first portion and the second portion.

5. The electronic device of claim 1, wherein the at least one speaker comprises a first speaker which is directed in a second direction forming an angle ranging from 45 to 135 degrees with respect to the first direction.

6. The electronic device of claim 5, wherein the at least one speaker comprises a second speaker disposed in the speaker structure to be directed in a third direction opposite to the first direction.

7. The electronic device of claim 6, wherein the second speaker outputs a sound of a register lower than that of the first speaker.

8. The electronic device of claim 1, wherein the first portion and the second portion are integrally formed with each other.

9. The electronic device of claim 1, wherein the space is extended in a direction orthogonal to the first direction.

10. The electronic device of claim 1, wherein the at least one first opening is adjacent to a plurality of penetrating holes which are formed on the housing to overlap the at least one speaker at least in part.

11. The electronic device of claim 1, wherein the second portion comprises a portion that is convex in a direction opposite to the first direction.

12. The electronic device of claim 1, wherein the space comprises:
    a first space formed between the first plate and the second portion; and
    a second space formed between the first plate and one surface of the first structure that opposes the first plate.

13. The electronic device of claim 12, wherein the first space has a greater volume in the first direction than that of the second space.

14. The electronic device of claim 1, wherein the second portion further comprises an extension portion that is disposed on one surface of the first structure opposing the first plate.

15. The electronic device of claim 14, further comprising an elastic member disposed between the extension portion and the one surface of the first structure.

16. The electronic device of claim 1, wherein the second portion comprises a concavo-convex surface that opposes the first plate.

17. The electronic device of claim 1, wherein the at least one component comprises:
    a first component being in contact with a first region of the first portion; and
    a second component being in contact with a second region of the first portion.

18. The electronic device of claim 17, wherein at least a part of the second region is directly or indirectly in contact with the second portion.

19. The electronic device of claim 17, wherein the first component comprises a printed circuit board having at least one amplifier mounted thereon, and
    wherein the second component comprises a power supply changing a current or voltage characteristic with respect to power supplied from an external source.

20. The electronic device of claim 1, further comprising at least one microphone,
    wherein the first plate is disposed between the at least one microphone and the speaker structure.

* * * * *